(12) United States Patent
Zhang

(10) Patent No.: US 12,336,181 B2
(45) Date of Patent: *Jun. 17, 2025

(54) THREE-DIMENSIONAL MEMORY DEVICE HAVING SOURCE-SELECT-GATE CUT STRUCTURES AND METHODS FOR FORMING THE SAME

(71) Applicant: YANGTZE MEMORY TECHNOLOGIES CO., LTD., Wuhan (CN)

(72) Inventor: Zhong Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/518,798

(22) Filed: Nov. 24, 2023

(65) Prior Publication Data

US 2024/0090227 A1 Mar. 14, 2024

Related U.S. Application Data

(63) Continuation of application No. 17/162,861, filed on Jan. 29, 2021, now Pat. No. 11,871,573, which is a
(Continued)

(51) Int. Cl.
*H10B 43/35* (2023.01)
*H01L 23/522* (2006.01)
(Continued)

(52) U.S. Cl.
CPC ......... *H10B 43/35* (2023.02); *H01L 23/5226* (2013.01); *H01L 23/5283* (2013.01);
(Continued)

(58) Field of Classification Search
CPC ........ H10B 43/35; H10B 41/27; H10B 41/35; H10B 43/27; H10B 43/50; H10B 43/10;
(Continued)

(56) References Cited

U.S. PATENT DOCUMENTS 10,170,570 B1 * 1/2019 Sonehara ............... H10B 43/27
11,871,573 B2 * 1/2024 Zhang .................... H10B 43/10
(Continued)

FOREIGN PATENT DOCUMENTS

CN 102468282 A 5/2012
CN 105453266 A 3/2016
(Continued)

OTHER PUBLICATIONS

International Search Report issued in corresponding International Application No. PCT/CN2020/139361, mailed Sep. 26, 2021, 4 pages.
(Continued)

*Primary Examiner* — Douglas W Owens
(74) *Attorney, Agent, or Firm* — BAYES PLLC

(57) ABSTRACT

A three-dimensional (3D) memory device includes a memory stack including a memory block. The memory block includes a memory array structures and a staircase structure in a first lateral direction, and fingers in a second lateral direction perpendicular to the first lateral direction. The fingers include a first finger and a second finger. The 3D memory device also includes a source-select-gate (SSG) cut structure extending through a portion of the memory stack and between the first finger and the second finger. The staircase structure includes a first staircase connected to first memory cells in the first finger and a second staircase connected to second memory cells in the second finger.

20 Claims, 14 Drawing Sheets

Related U.S. Application Data continuation of application No. PCT/CN2020/139340, filed on Dec. 25, 2020.

(51) Int. Cl.
  *H01L 23/528* (2006.01)
  *H10B 41/27* (2023.01)
  *H10B 41/35* (2023.01)
  *H10B 43/27* (2023.01)

(52) U.S. Cl.
  CPC .............. *H10B 41/27* (2023.02); *H10B 41/35* (2023.02); *H10B 43/27* (2023.02)

(58) Field of Classification Search
  CPC ........ H10B 41/50; H10B 41/40; H10B 43/20; H10B 43/40; H01L 23/5226; H01L 23/5283
  See application file for complete search history.

(56) References Cited

U.S. PATENT DOCUMENTS

| | | | |
|---|---|---|---|
| 2018/0145029 A1 | 5/2018 | Tanzawa | |
| 2018/0261613 A1 | 9/2018 | Ariyoshi | |
| 2018/0350823 A1 | 12/2018 | Or-Bach et al. | |
| 2018/0358375 A1* | 12/2018 | Ku | ........................ H10B 43/10 |
| 2019/0006275 A1* | 1/2019 | Kobayashi | ........ H01L 21/76877 |
| 2019/0319033 A1* | 10/2019 | Lee | ........................ H10B 43/35 |
| 2019/0326166 A1* | 10/2019 | Nam | ...................... H10B 43/27 |
| 2019/0363006 A1* | 11/2019 | Min | .................. H01L 21/31111 |
| 2019/0393240 A1 | 12/2019 | Kim et al. | |
| 2020/0006378 A1 | 1/2020 | Huo | |
| 2021/0358868 A1* | 11/2021 | Jhothiraman | .......... H10B 43/35 |
| 2022/0208775 A1 | 6/2022 | Zhang | |
| 2024/0341096 A1* | 10/2024 | Zhang | .................... H10B 41/35 |

FOREIGN PATENT DOCUMENTS

| | | |
|---|---|---|
| CN | 110114881 A | 8/2019 |
| CN | 110600481 A | 12/2019 |
| CN | 110634872 A | 12/2019 |
| CN | 111108600 A | 5/2020 |
| CN | 111430352 A | 7/2020 |
| CN | 111919299 A | 11/2020 |
| CN | 112106193 A | 12/2020 |
| CN | 112106198 A | 12/2020 |
| TW | I706547 B | 10/2020 |

OTHER PUBLICATIONS

International Search Report issued in corresponding International Application No. PCT/CN2020/139340, mailed Sep. 27, 2021, 4 pages.

* cited by examiner

THREE-DIMENSIONAL MEMORY DEVICE HAVING SOURCE-SELECT-GATE CUT STRUCTURES AND METHODS FOR FORMING THE SAME

CROSS REFERENCE TO RELATED APPLICATIONS

This application is a continuation of U.S. application Ser. No. 17/162,861, filed on Jan. 29, 2021, which is a continuation of International Application No. PCT/CN2020/139340, filed on Dec. 25, 2020, both of which are incorporated herein by reference in their entireties. This application is also related to U.S. application Ser. No. 17/162,904, filed on Jan. 29, 2021, which is hereby incorporated by reference in its entirety.

BACKGROUND

The present disclosure relates to three-dimensional (3D) memory devices having cut structures and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY 3D memory devices having source-select-gate (SSG) cut structures and methods for forming the same are disclosed herein.

In one aspect, a 3D memory device includes a memory stack including a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes a SSG cut structure extending in a SSG of the memory stack and between adjacent ones of the plurality of strings. The SSG cut structure includes a first portion between a first string and a second string and extends in the bridge structure in the first lateral direction. The staircase zone includes a first staircase conductively connected to first memory cells in the first string through the bridge structure and a second staircase conductively connected to second memory cells in the second string in the first memory array structure through the bridge structure.

In another aspect, a 3D memory device includes a memory stack includes a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes a SSG cut structure extending in a SSG of the memory stack between adjacent ones of the plurality of strings. The SSG cut structure includes a first portion extending in the bridge structure in the first lateral direction. The staircase zone includes a first group of staircases conductively connected to first memory cells in a respective one of a first number of the plurality of strings through the bridge structure. The staircase zone also includes a second group of staircases each conductively connected to second memory cells in a second number of the plurality of strings directly.

In still another aspect, a 3D memory device includes a memory stack including a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes an SSG cut structure extending in a SSG of the memory stack between adjacent ones of the plurality of strings. The SSG cut structure includes a first portion of extending in the bridge structure in the first lateral direction. The first portion of the SSG cut structure is between a first portion and a second portion of the bridge structure and between the first portion and a third portion of the bridge structure. The staircase zone includes a pair of staircases conductively connected to first memory cells in a first string in the first and second memory array structures through the first portion of the bridge structure, and a pair of staircases connected to second memory cells in a second string in a respective one of the first and second memory array structures through respectively the second portion and the third portion of the bridge structure.

In yet another aspect, a method for forming a 3D memory device is provided. The method includes forming a first number of dielectric pairs on a substrate having an array region and a staircase region, each of the dielectric pairs including a first layer of a sacrificial material and a second layer of a dielectric material different from the sacrificial material. The method also includes forming an initial SSG cut structure in the first number of dielectric pairs. The method also includes forming a second number of dielectric pairs on the first number of dielectric pairs to form a stack structure. The method further includes patterning the stack structure to form a first dielectric structure and a second dielectric structure in the array region, a staircase structure in the staircase region, and a SSG cut structure in the array region and the staircase region. The staircase structure includes a dielectric bridge and a plurality of staircases. The plurality of staircases are aligned along a first lateral direction and include a first staircase and a second staircase each coupled to a first dielectric string in the first and second dielectric structures through the dielectric bridge.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1:
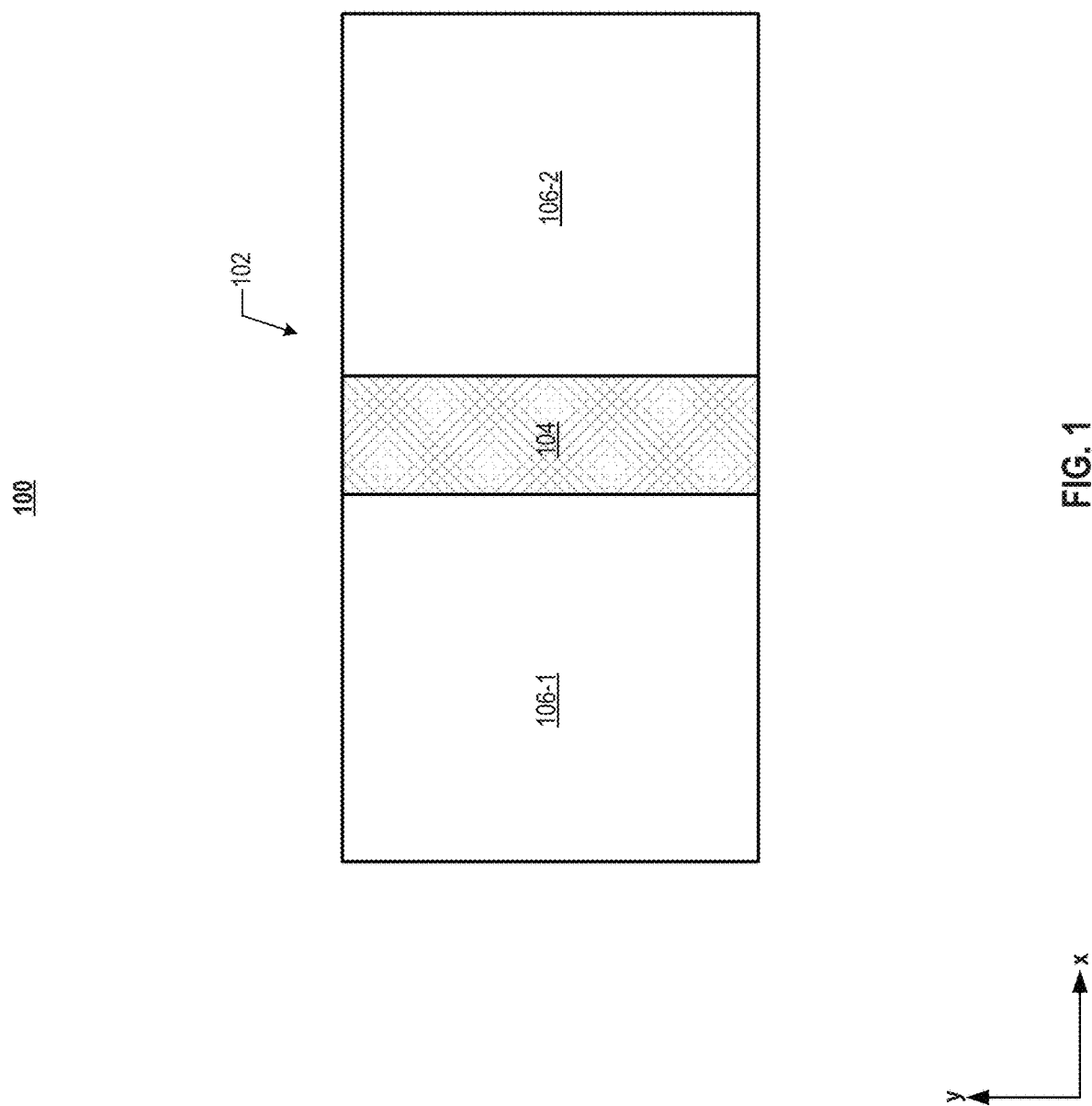
FIG. 1 illustrates a schematic diagram of an exemplary 3D memory device having a staircase structure, according to some implementations of the present disclosure.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one implementation," "an implementation," "an example implementation," "some implementations," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or in a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cell transistors on a laterally-oriented substrate so that the memory cells extend in the vertical direction with respect to the substrate. As used herein, the term "vertical/vertically" means nominally perpendicular to the lateral surface of a substrate.

As used herein, the term "memory string" refers to one or more rows of memory cells (or channel structures) between a SSG cut structure and a slit structure, the SSG cut structure being a bottom-select-gate (BSG) cut structure. As used herein, the term "memory finger" refers to one or more rows of memory cells (or channel structures between adjacent slit structures. As used herein, a "string" refers to the physical location/area that a memory string is located. Memory cells in a memory string may be located in a corresponding string of the 3D memory device. As used herein, a "finger" refers to the physical location/area that a memory finger is located. Memory cells in a memory finger may be located in a corresponding finger of the 3D memory device. As used herein, the term "dielectric string" refers to the one or more rows of channel structures before a gate-replacement process to form a plurality of conductive layers (e.g., word lines).

In some 3D memory devices, memory cells for storing data are vertically stacked through a stacked storage structure (e.g., a memory stack). To control memory cells in various portions of a 3D memory device, SSG cut structures, such as BSG cut structures, are formed in the 3D memory device to divide the memory cells in a memory block into memory fingers and memory strings. Word line contacts are formed to be in contact with different portions of the memory cells such that a voltage can be applied on a respective portion of memory cells. By applying voltages on respective portions of the memory cells, memory blocks, memory fingers, and memory strings can be separately controlled to implement block control, finger control, and string control. Different memory blocks, memory fingers, and memory strings can be controlled to perform operations such as write, erase, read, etc. However, in some existing 3D memory devices, the design and formation of a BSG cut structure can be undesirably complex.

Figure 6A:
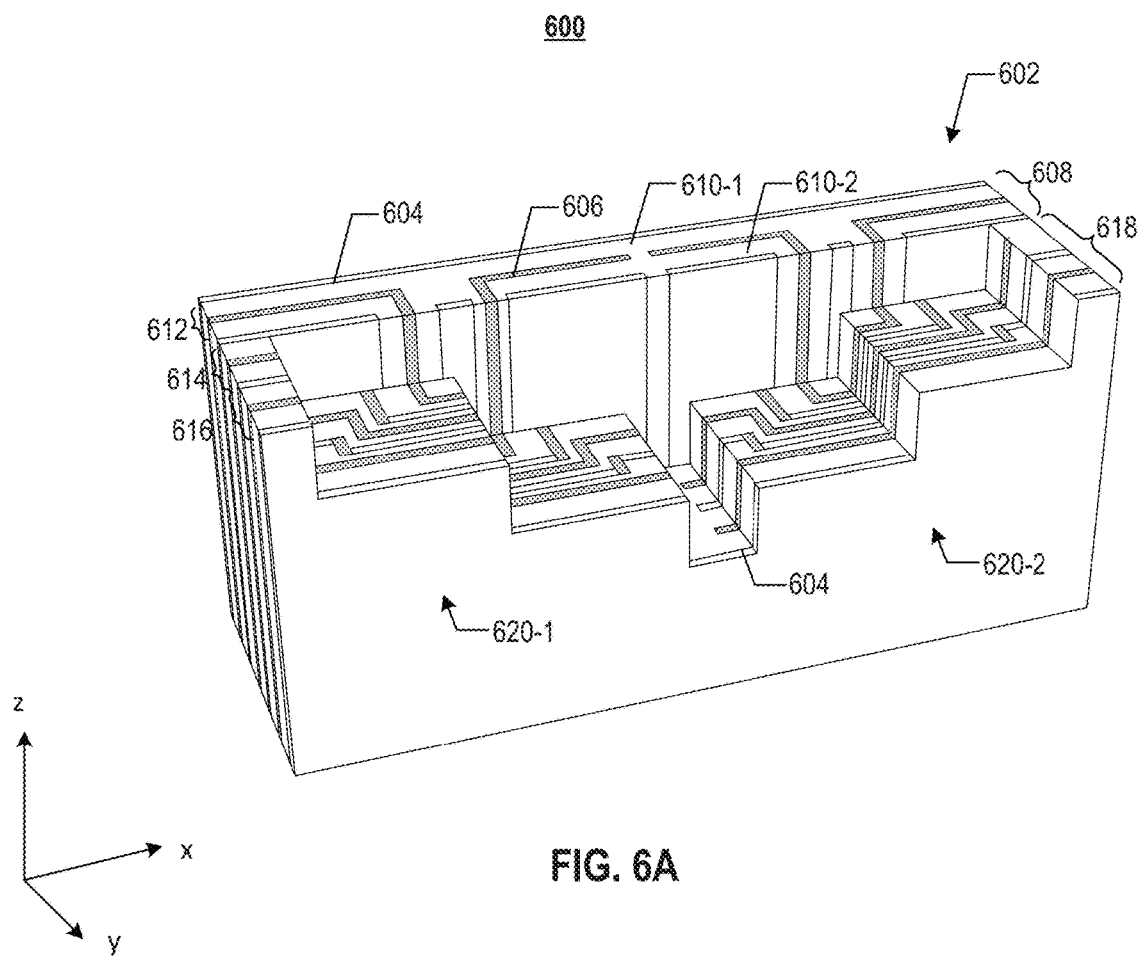
FIG. 6A illustrates a top front perspective view of a staircase structure having a SSG cut structure in a 3D memory device.
Figure 6B:
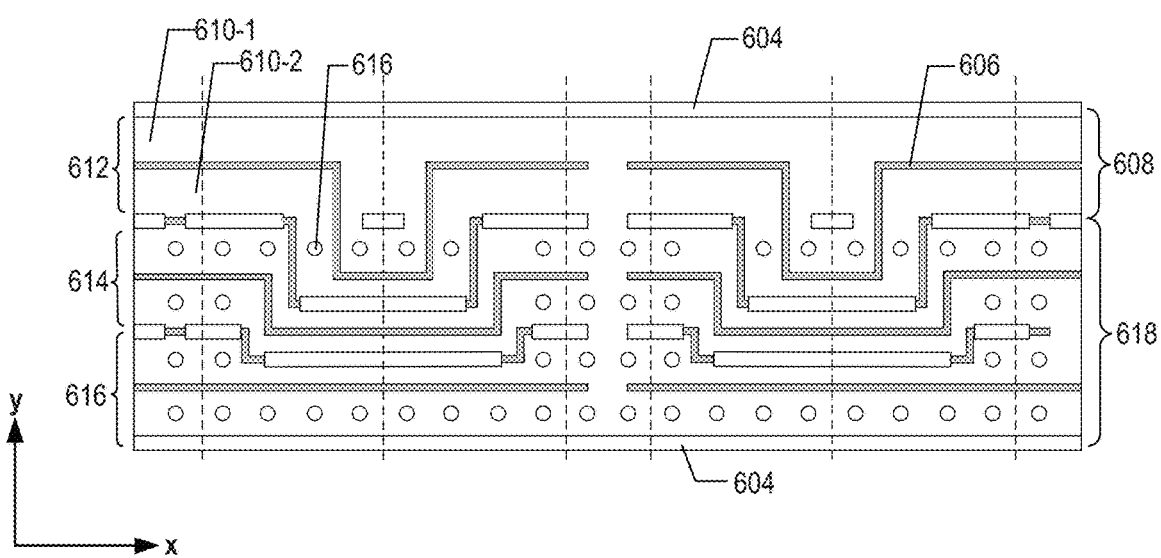
FIG. 6B illustrates a plan view of the 3D memory device in FIG. 6A.

For example, FIG. 6A illustrates a top-front perspective view of a staircase structure 602 of an existing 3D memory device 600 with a BSG cut structure 606, and FIG. 6B illustrates a top view of 3D memory device 600. As shown in FIGS. 6A and 6B, staircase structure 602 is in an intermediate of a pair of memory array structures in the x-direction and includes a bridge structure 608 and a staircase zone 618. Staircase zone 618 includes a pair of staircases 620-1 and 620-2, facing each other in the x-direction. A pair of slit structures 604 sandwich staircase structure 602 in the y-direction such that staircase structure 602 is conductively connected to a memory block in the memory array structures. To implement a bilateral word line-driving scheme for string control, in staircase structure 602, a plurality of slit structures 604 divide staircase structure 602 into three portions 612, 614, and 616, each corresponding to a respective memory finger in the memory array structures. Portion 612 includes bridge structure 608, and portions 614 and 616 include staircases 620-1 and 620-2. The memory finger corresponding to the respective portion is aligned, in the x-direction, with the respective portion and conductively connected to the respective portion. A BSG cut structure 606 that includes a plurality of BSG portions further divide portions 612, 614, and 616 each into a pair of sub-portions, each sub-portion being in contact with a respective memory string in the memory array structures. For example, portion 612 is divided into sub-portions 610-1 and 610-2 and are each in contact with a respective memory string in the memory array structures. Sub-portions in staircase zone 618 are conductively connected to memory strings conductively connected to staircases 620-1 and 620-2.

To form conductive contact between word line contact 616 and a memory string of respective level, a number of divisions are formed on the stair of the respective level. The number of divisions is equal to the total number of memory strings conductively connected to staircase structure 602. In this example, the memory block includes six memory strings, and each stair is divided into six divisions.

As shown in FIGS. 6A and 6B, word line contacts 616 need to be conductively connected to each memory string that is conductively connected to staircase structure 602. As described above, the memory strings include the two memory strings conductively connected to bridge structure 608 and four memory strings conductively connected with staircases 620-1 and 620-2. As a result, BSG cut structure 606 is routed from bridge structure 608 to staircase zone 618 such that two divisions, conductively connected to the memory strings corresponding to bridge structure 608, are formed in each stair. BSG cut structure 606 in the staircases 620-1 and 620-1 are also routed both in the x-direction and they-direction to form the four divisions conductively connected to the memory strings corresponding to the staircases 620-1 and 620-2 in each stair. The layout of BSG cut structure 606 and slit structure 604 can thus be undesirably complex. Especially when more memory strings are formed in a memory block, the landing area can be more challenging to form using the existing layout of BSG cut structure. Also, an undesirably large number of word line contacts 616 (e.g., 6 in this example) are formed on the same stair, making 3D memory device 600 susceptible to short circuit. Product yield may be impaired.

Various implementations in accordance with the present disclosure provide staircase structures having SSG cut structures and fabrication methods thereof. The staircase structure has a bridge structure and a staircase zone, which includes a plurality of staircases. The layout of the SSG cut structures separate the landing area of word line contacts conductively connected to the memory strings corresponding to the bridge structure from the landing area of word line contacts conductively connected to the memory strings corresponding to the staircases. In some implementations, word line contacts conductively connected to the memory strings corresponding to the bridge structure and word line contacts conductively connected to the memory strings corresponding to the staircases are formed on different staircases. Amongst the staircases in the staircase zone, some are dedicated to providing landing area only for the word line contacts for the memory strings corresponding to these staircases, and the rest are dedicated to providing landing area only for the word line contacts for memory strings corresponding to the bridge structure. Compared with an existing 3D memory device, in the staircase zone of the present disclosure, memory strings corresponding to the bridge structure are routed to dedicated staircases to form conductive contact with word line contacts, instead of sharing landing area on stairs with divisions conductively connected to other memory strings. The formation of the landing area for word line contacts can be more flexible, and the layout of the SSG cut structure can be less complex. Also, because fewer divisions are formed on each stair, it is easier to form word line contacts in each division. The disclosed SSG cut structure may simplify the layout and structures for string control in a 3D memory device.

In the present disclosure, a first staircase and a second staircase are conductively connected to a first memory string in the two memory array structures on both sides of the staircase structure through the bridge structure. Through the bridge structure, a third staircase is conductively connected to a second memory string in one of the memory array structures, and a fourth staircase is conductively connected to the second memory string in one of the memory array structures. A fifth staircase and a sixth staircase are each conductively connected to the rest of memory strings in a respective one of the memory array structures. The SSG cut structures, e.g., a BSG cut structure, extend in the bridge structure and the staircases to allow the conductive connection to be formed. In some implementations, a SSG cut structure extends in the bridge structure, between the first and third staircases, and between the second and fourth staircases such that electric current can flow in the paths defined by the SSG cut structure. The SSG cut structure also extends in the staircases to divide the staircases into a plurality of divisions, which are respectively in contact with the respective memory strings. In some implementations, a SSG cut structure extends in the bridge structure but not between any staircases. Instead, an insulating structure is located between the first and third staircases and between the second and fourth staircases, such that electric current can flow in the paths defined by the SSG cut structure and the insulating structure. The disclosed structures and methods can be employed to implement string control in a memory block with two or more memory fingers.

FIG. 1 illustrates a schematic diagram of an exemplary 3D memory device 100 having a staircase structure 104, according to some implementations of the present disclosure. In some implementations, 3D memory device 100 includes multiple memory planes 102. Each memory plane 102 can include a memory array structure 106-1/106-2 and a staircase structure 104 in the intermediate of memory array structure 106-1/106-2 and laterally dividing memory array structure 106-1/106-2 into a first memory array structure 106-1 and a second memory array structure 106-2 in the x-direction (the word line direction). In some implementations, memory array structure 106-1/106-2 are located in an array region of 3D memory device 100, and staircase structure 104 is located in a staircase region of 3D memory device 100. In some implementations, for each memory plane 102, staircase structure 104 is in the middle of memory array structure 106-1/106-2. That is, staircase structure 104 can be a center staircase structure, which equally divides memory array structure 106-1/106-2 into first and second memory array structures 106-1 and 106-2 with the same number of memory cells. For example, first and second memory array structures 106-1 and 106-2 may be symmetric in the x-direction with respect to center staircase structure 104. It is understood that in some examples, staircase structure 104 may be in the intermediate, but not in the middle (center), of memory array structure 106-1/106-2, such that first and second memory array structures 106-1 and 106-2 may have different sizes and/or numbers of memory cells. In some implementations, 3D memory device 100 is a NAND Flash memory device in which memory cells are provided in the form of an array of NAND memory strings (not shown) in first and second memory array structures 106-1 and 106-2. First and second memory array structures 106-1 and 106-2 can include any other suitable components including, but not limited to, gate line slits (GLSs), through array contacts (TACs), array common sources (ACSs), etc.

Each word line (not shown) of memory plane 102 extending laterally in the x-direction can be separated by staircase structure 104 into two parts: a first word line part across first memory array structure 106-1, and a second word line part across second memory array structure 106-2. The two parts of each word line can be conductively connected by a bridge structure (not shown) in staircase structure 104 at a respective stair in staircase structure 104. Memory array structure 106-1/106-2 may include a plurality of memory blocks each extending laterally in the x-direction and be separated by staircase structure 104 into two parts: a first memory block in first memory array structure 106-1 and a second memory block in second memory array structure 106-2. Each memory block can be divided into a plurality of memory fingers, each extending laterally in the x-direction can be separated by staircase structure 104 into two parts: a first memory finger part in first memory array structure 106-1, and a second memory finger part in second memory array structure 106-2. Each memory finger can be divided into a pair of memory strings, each extending laterally in the x-direction can be separated by staircase structure 104 into two parts: a first memory string part in first memory array structure 106-1, and a second memory string part in second memory array structure 106-2.

Staircase structure 104 may be formed over a substrate (not shown). The substrate can include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, the substrate is a thinned substrate (e.g., a semiconductive layer), which was thinned by grinding, etching, chemical mechanical polishing (CMP), or any combination thereof. In some implementations, the substrate includes silicon.

Figure 2A:
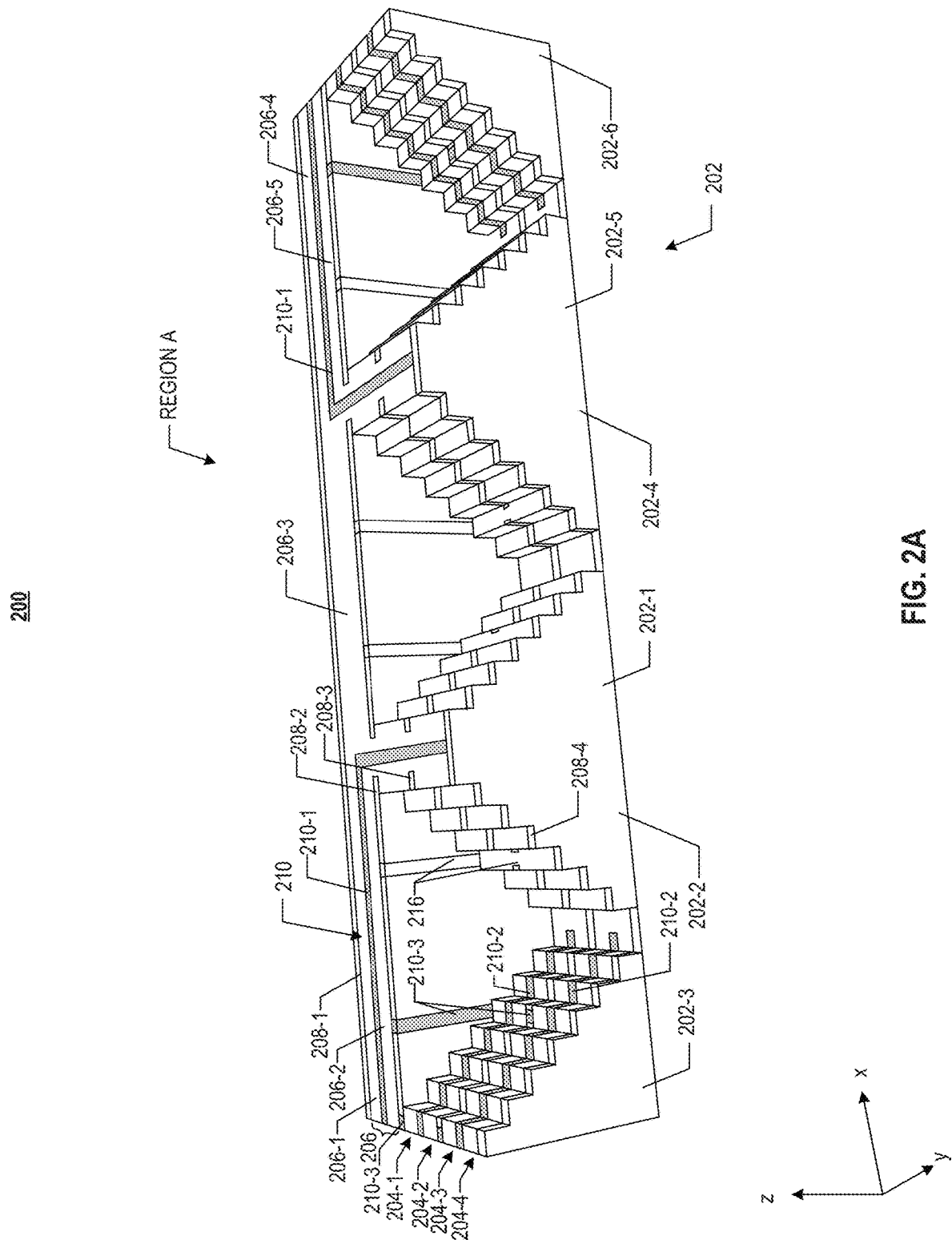
FIG. 2A illustrates a top front perspective view of an exemplary staircase structure having a SSG cut structure in a 3D memory device, according to some implementations of the present disclosure.
Figure 2B:
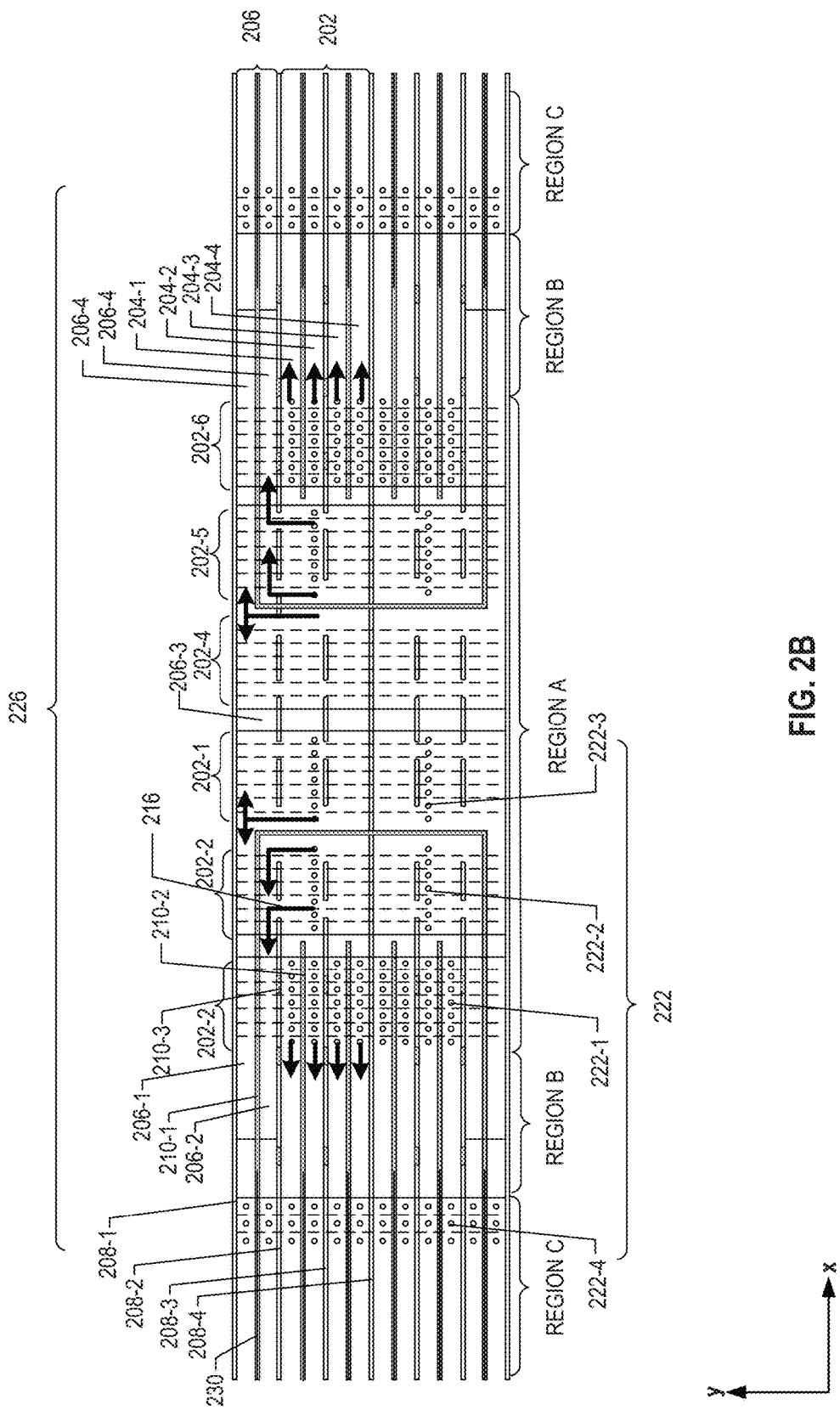
FIG. 2B illustrates a plan view of the exemplary 3D memory device in FIG. 2A.

FIG. 2A illustrates a top-front perspective view of an exemplary 3D memory device 200 having a staircase structure 226 with a SSG cut structure 210, according to some implementations of the present disclosure. FIG. 2B illustrates a top view of 3D memory device 200. 3D memory device 200 may be one example of part of memory plane 102 in FIG. 1 that includes staircase structure 104. Staircase structure 226 of 3D memory device 200 may be one example of staircase structure 104 in memory plane 102. For illustrative purposes, FIG. 2A shows staircase structure 226 corresponding to one memory block in memory array structure 106-1/106-2, which is the upper half of the structure shown FIG. 2B (in they-direction). FIG. 2B shows a pair of staircase structures 226 symmetrical to each other in the y-direction. For ease of explanation, FIGS. 2A and 2B are described together.

As shown in FIGS. 2A and 2B, staircase structure 226 may be located between a pair of slit structures 208-1 and 208-4. In some implementations, each slit structure includes a GLS. Staircase structure 226, between slit structures 208-1 and 208-2, may be conductively connected to a memory block (or memory cells in a block) in the memory array structure. In some implementations, staircase structure 226 is considered as part of a memory block. Staircase structure 226 may include a bridge structure 206 and a staircase zone 202, each extending laterally along the x-direction and adjacent to each other. Staircase zone 202 may include a plurality of staircases, i.e., 202-1, 202-2, 202-3, 202-4, 202-5, and 202-6 aligned in the x-direction. Each of these staircases includes a plurality of stairs. 3D memory device 200 may also include slit structures 208-2 and 208-3, between slit structures 208-1 and 208-4, extending in the x-direction. Slit structures 208-2 and 208-3 may divide staircase structure 226 between slit structures 208-1 and 208-4 into portions that are conductively connected to corresponding memory fingers (or memory cells in the fingers) in the first and second memory structures. SSG cut structure 210, e.g., a BSG cut structure, may extend in staircase structure 226 and divide the portions into a plurality of sub-portions that are conductively connected to corresponding memory strings (or memory cells in the strings). A plurality of word line contacts 222 are landed in staircase zone 202 to form conductive connections with corresponding memory strings. The detailed description of staircase 226 is provided as follows.

Bridge structure 206 can include vertically interleaved conductive layers and dielectric layers (not shown), and the conductive layers (e.g., metal layers or polysilicon layers) can function as part of word lines. The conductive layers can include conductor materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, or any combination thereof. In some implementations, the conductive layers include metals, such as tungsten, and the dielectric layers include silicon oxide.

The word lines in bridge structure 206 can be preserved to bridge word line contacts 222 landed on the staircases and the first and second memory array structures in order to achieve the bilateral word line-driving scheme for string control (or block control and/or finger control). As shown in FIGS. 2A and 2B, staircases 202-2 and 202-3 may be facing each other (e.g., stairs of staircases 202-2 and 202-3 facing inwardly towards opposite directions), staircases 202-1 may be facing away from staircase 202-3 (e.g., stairs of staircases 202-2 and 202-3 facing outwardly towards opposite directions) and facing staircase 202-4, staircase 202-5 may be facing away from staircase 202-4 and facing staircase 202-6. Staircases 202-1 and 202-2 may be in a back-to-back position, and staircases 202-4 and 202-5 may be in a back-to-back position. Staircases 202-3 and 202-6 may each be in contact with and conductively connected to corresponding memory strings (or memory cells in the strings) in the respective one of the first and second memory structures. As an example, stairs of staircases 202-3, 202-1, and 202-5 face the positive x-direction, and stairs of staircases 202-2, 202-4, and 202-6 face the negative x-direction.

In some implementations, staircases 202-1, 202-2, 202-4, and 202-5 are conductively connected to, e.g., the memory cells in, at least one of the first and second memory structures through bridge structure 206. In an example, one or more stairs in staircase 202-2 may be conductively connected to the first memory array structure (in the negative x-direction) by a respective word line part extending in the negative x-direction through bridge structure 206. Bridge structure 206, however, may not conductively connect staircase 202-2 to the second memory array structure (in the positive x-direction) because the respective word line part extending in the positive x-direction is cut off by SSG cut structure 210. For similar reasons, one or more stairs in staircase 202-5 may be conductively connected to the second memory array structure (in the positive x-direction) by a respective word line part extending in the positive x-direction through bridge structure 206. Bridge structure 206 may not conductively connect staircase 202-5 to the first memory array structure (in the positive x-direction) because the respective word line part extending in the negative x-direction is cut off by SSG cut structure 210.

In another example, bridge structure 206 may also not conductively connect staircase 202-3 to the first memory array structure (in the negative x-direction) because the respective word line part extending in staircase 202-3 is insulated/separated from bridge structure 206 by slit structure 208-2. For similar reasons, bridge structure 206 may also not conductively connect staircase 202-6 to the second memory array structure (in the negative x-direction) because the respective word line part extending in staircase 202-6 is insulated/separated from bridge structure 206 by slit structure 208-2. Staircases 202-3 may be respectively in contact with and conductively connected to the word line part extending in the first memory array structure. Staircases 202-4 may be respectively in contact with and conductively connected to the word line part extending in the second memory array structure.

In a further example, bridge structure 206 may conductively connect staircases 202-1 and 202-4 to both of the first and second memory array structures in the positive and negative x-directions through bridge structure 206 (e.g., through the word lines extending in both positive and negative x-directions in bridge structure 206) because bridge structure 206 is not cut off by SSG cut structure 210 in both positive and negative x-directions. In some implementations, staircases 202-1 and 202-4 are referred to two sub-staircases of the staircase that is conductively connected to the same memory string in first and second memory array structures 106-1 and 106-2.

As shown in FIG. 2A, bridge structure 206 may be divided into a plurality of portions, by SSG cut structure 210, to conductive electric current from staircases 202-1, 202-2, 202-4, and 202-5, into respective memory array structures. Bridge structure 206 may include a first portion 206-1 and a second portion 206-2, insulated/separated from each other by SSG cut structure 210 in bridge structure 206 adjacent to staircases 202-3 and 202-2. Bridge structure 206 may also include a third portion 206-3 adjacent to staircases 202-1 and 202-4, third portion 206-3 being in contact with and conductively connected to first portion 206-1. Bridge structure 206 may further include a fourth portion 206-4 and a fifth portion 206-5, insulated/separated from each other by SSG cut structure 210 in bridge structure 206 adjacent to staircases 202-5 and 202-6, fourth portion 206-4 being in contact with and conductively connected to third portion 206-3. In some implementations, staircase 202-2 is conductively connected to the first memory array structure through second portion 206-2 of bridge structure 206. In some implementations, staircases 202-1 and 202-4 are each conductively connected to the first and second memory array structures through first portion 206-1, third portion 206-3, and fourth portion 206-4 of bridge structure 206. In some implementations, staircase 202-5 is conductively connected to the second memory array structure through fifth portion 206-5 of bridge structure 206. In some implementations, not through bridge structure 206, staircase 202-3 is conductively connected to the first memory array structure, and staircase 202-6 is conductively connected to the second memory array structure.

Each staircase, i.e., 202-1, 202-2, 202-3, 202-4, 202-5, and 202-6, may include a plurality of stairs. Each stair (as shown as a "level") of these staircases can include one or more material layer pairs. In some implementations, the top material layer of each stair is a conductive layer for interconnection with word line contacts 222 in the vertical direction. In some implementations, every two adjacent stairs of each staircase are offset by a nominally same distance in the z-direction and a nominally same distance in the x-direction. Each offset thus can form a "landing area" for interconnection with word line contacts 222 of 3D memory device 200 in the z-direction direction. In some implementations, for each of staircases 202-1, 202-2, 202-4, and 202-5, the conductive layer in each stair is conductively connected to a respective conductor layer of the same level in bridge structure 206 such that the stair can be conductively connected to the word line part of the same level in the respective memory string. The materials of the conductive layers and the dielectric layers may be respectively the same as the materials of the conductive layers and dielectric layers in bridge structure 206.

As shown in FIGS. 2A and 2B, slit structures 208-1 and 208-4 may continuously extend in the x-direction, and staircase structure 226 may be conductively connected to a memory block in the first and second memory array structures in the positive and negative x-directions. Between the first and second memory array structures, slit structure 208-2 may be located between bridge structure 206 and staircase zone 202, and slit structure 208-3 may be located in staircase zone 202. Although not shown in the figures, each of slit structures 208-1, 208-2, 208-3, and 208-4 may continue to extend in the first and second memory array structures. Specifically, slit structures 208-1 and 208-4 may define a memory block in the first and second memory array structures, and slit structures 208-2 and 208-3 may divide the memory cells in the memory block into three memory fingers. A plurality of channel structures may be formed in each memory block. The intersection of the channel structures and the word lines (or conductive layers) in the first and second memory array structures may form a plurality of memory cells in the memory blocks/fingers/strings.

Slit structures 208-2 and 208-3 may not extend continuously in the x-direction in staircase structure 226. As shown in FIGS. 2A and 2B, slit structures 208-2 and 208-3 may each be disconnected in the x-direction. SSG cut structure 210 may extend between the disconnected portions of slit structures 208-2 and 208-3. In the x-direction, the lateral distance between SSG cut structure 210 and adjacent portions of slit structures 208-2 and 208-3 may be sufficiently large such that SSG cut structure 210 may not be in contact with slit structures 208-2 and 208-3. In some implementations, a source contact structure, having an insulating spacer and a source contact in the dielectric spacer, may be formed in each of slit structures 208-1, 208-2, 208-3, and 208-4. In some implementations, a source contact portion in an insulating spacer portion is formed in each portion of slit structures 208-2 and 208-3. The source contact and source contact portion may include a suitable conductive material such as W, Co, Al, Cu, silicides, polysilicon, or a combination thereof. The insulating spacer and insulating spacer portion may include a suitable dielectric material such as silicon oxide, silicon oxynitride, or a combination thereof. The source contact and the source contact portion may be conductively connected to the source of 3D memory device 200 for applying a source voltage on memory cells in memory block/fingers/strings.

Also, as shown in FIGS. 2A and 2B, 3D memory device 200 may include one or more passage structure 216 in slit structures 208-2 and 208-3. Passage structure 216 may also be referred to as an "H cut" between adjacent memory strings. Each passage structure 216 may extend vertically along the z-direction and aligned with the respective slit structure in the x-direction. Passage structure 216 may provide a conductive path for electric current in at least one stair (e.g., the stair conductively connected to passage structure 216) to flow into bridge structure 206 such that the at least one stair is conductively connected to the respective memory array structure(s) through bridge structure 206. In some implementations, passage structure 216 may extend vertically into the substrate. In some implementations, passage structure 216 may extend from the substrate to the top surface of a stair. In some implementations, passage structure 216 may have the same depth (i.e., along the z-direction) as the respective slit structure 208-2/208-3. In some implementations, a dimension (i.e., along the x-direction) of passage structure 216 may be less than or equal to the dimension of a stair. In some implementations, a dimension (i.e., along the y-direction) of passage structure 216 may be the same as that of the respective slit structure 208-2/208-3.

Passage structure 216 may include a plurality of conductive layers and a plurality of dielectric layers interleaved along the z-direction. The conductive layers may each be in contact with and conductively connected to the respective conductive layer of the same level in bridge structure 206, and the dielectric layers may each be in contact with the respective dielectric layer of the same level in bridge structure 206. In some implementations, the conductive layers in passage structure 216 may conductively connect a conductive layer in a staircase (e.g., 202-1, 202-2, 202-4, or 202-5) to a conductive layer of the same level in bridge structure 206. The materials of conductive layers and dielectric layers in passage structure 216 may be respectively the same as those of bridge structure 206. Passage structure 216 may be considered as an opening in the respective slit structure 208-2/208-3 to allow conductive layers in bridge structure 206 to be in contact with conductive layers of the same levels in a staircase (e.g., 202-1, 202-2, 202-4, and/or 202-5). When passage structure 216 is in contact with a stair (e.g., in contact with the top surface of the stair), passage structure 216 becomes in contact with and conductively connected to the conductive layers in the stairs from the stair in contact with passage structure 216 to the bottom of the respective staircase. Electric current of the stairs conductively connected to passage structure 216 may flow into bridge structure 206 through passage structure 216. In an example, as shown in FIG. 2A, passage structure 216 may be in contact with the third stair and conductively connected to conductive layers in the first three stairs (e.g., from bottom to top) of staircase 202-2. Electric current in these three stairs may flow into second portion 206-2 of bridge structure 206. Electric current in the rest of the stairs (e.g., the stairs above these three stairs in the z-direction) may flow into second portion 206-2 of bridge structure 206 through the opening between slit structure 208-2 and SSG cut structure 210. FIG. 2B illustrates the exemplary directions of the electric current in bold arrows. Of course, in various implementations, at least a portion of the electric current in these three stairs may also flow into second portion 206-2 of bridge structure 206 through the opening between slit structure 208-2 and SSG cut structure 210.

Passage structure 216 may improve the conductive connection between staircases (e.g., 202-1, 202-2, 202-4, and/or 202-5) and bridge structure 206, and thus improve the control on the memory fingers and memory strings connected to bridge structure 206. In some implementations, at least one passage structure 216 is located between bridge structure 206 and staircase 202-2. In some implementations, at least one passage structure 216 is located between bridge structure 206 and staircases 202-1 and 202-4. In some implementations, at least one passage structure 216 is located between bridge structure 206 and staircase 202-5. In some implementations, at least one passage structure 216 is located between bridge structure 206 and each of staircases 202-1, 202-2, 202-4, and 202-5. In some implementations, at least one passage structure 216 is aligned with slit structure 208-3 and intersecting with staircase 202-2, 202-1, 202-4, and/or 202-2, conductively connecting the two portions of staircases 202-2, 202-1, 202-4, and/or 202-2 on the two sides of slit structure 208-3 (e.g., in the y-direction). The number of bridge structures 206 may be subjected to the design of 3D memory device 200 and should not be limited by the implementations of the present disclosure.

SSG cut structure 210 may extend in staircase structure 226 (e.g., in a SSG of 3D memory device 200) and separate electric current of each memory string. For example, in one memory block, a first number of memory strings may be conductively connected to bridge structure 206 and a second number of memory strings may be conductively connected to staircase zone 202 without bridge structure 206 (e.g., referred to as being conductively connected to directly). The first number and the second number may each be at least one. That is, the total number of memory strings conductively connected to staircase structure 226 is at least two. When the first number is at least two, SSG cut structure 210 may divide bridge structure 206 into a plurality of portions such that each of the first number of memory strings is conductively connected to a respective portion. Each respective portion may be conductively connected to at least one staircase so that the entire staircase can be dedicated to providing the landing area for word line contacts of only the respective memory string. In the meantime, SSG cut structure 210 may, along with slit structures 208-3, divide the staircases conductively connected to the second number of memory strings into a second number of divisions, each conductively connected to a respective memory string in the respective memory array structure. Each of the divisions may provide a landing area for the respective memory string of the respective level. The landing area for forming word line contacts for memory strings conductively connected to bridge structure 206 and memory strings conductively connected to staircases can be separated and optimized.

As shown in FIGS. 2A and 2B, SSG cut structure 210 may include a pair of first portions 210-1, a plurality of second portions 210-2, and a plurality of third portions 210-3. Portions of SSG cut structure 210 may extend vertically, in the z-direction, into the substrate to fully separate various parts of staircase structure 226. Each first portion 210-1 of SSG cut structure 210 may extend in bridge structure 206 in the x-direction and between, respectively in the y-direction, staircases 202-2 and 202-1 and staircases 202-4 and 202-5. First portion 210-1 of SSG cut structure 210 may divide bridge structure 206 adjacent to staircases 202-2 and 202-3 into first and second portions 206-1 and 206-2 of bridge structure 206 and may insulate staircase 202-1 from staircase 202-2. As shown in the directions of electric current in FIG. 2B, electric current in staircase 202-2 may flow into second portion 206-2 of bridge structure 206 through passage structure 216 (if any) and the opening between portions of slit structures 208-2/208-3 and first portion 210-1 of SSG cut structure 210; and electric current in staircase 202-5 may flow into fifth portion 206-5 of bridge structure 206 through passage structure 216 (if any) and the opening between slit structures 208-2/208-3 and first portion 210-1 of SSG cut structure 210. Electric current in staircases 202-4 and 202-1 may flow into third, first, and fourth portions 206-3, 206-1, and 206-4 of bridge structure 206 through passage structures 216 (if any) and the openings between portions of slit structures 208-2/208-3 and first portion 210-1 of SSG cut structure 210. In some implementations, first, third, and fourth portions 206-1, 206-3, and 206-4 of bridge structure 206 may be conductively connected to (and/or in contact with) a respective memory string in both the first and second memory array structures in the negative and positive x-directions. In some implementations, second portion 206-2 of bridge structure 206 may be conductively connected to (and/or in contact with) a respective memory string in the first memory array structure in the negative x-direction. In some implementations, fifth portion 206-5 of bridge structure 206 may be conductively connected to (and/or in contact with) the same memory string as second portion 206-5 in the second memory array structure in the positive x-direction. In some implementations, as shown in FIG. 2B, first portions 210-1 of SSG cut structures 210 in the two adjacent staircase zones 202 are in contact with each other in the y-direction.

SSG cut structure 210 may also include a plurality of second portions 210-2 extending in the x-direction in staircases 202-3 and 202-6. Second portions 210-2 of SSG cut structure 210 may not extend in staircases 202-2, 202-1, 202-4, and 202-5. As shown in FIGS. 2A and 2B, second portions 210-2 of SSG cut structure 210 may, along with slit structure 208-3, divide each stair in staircases 202-3 and 202-6 into a plurality of divisions. In some implementations, four divisions, 204-1, 204-2, 204-3, and 204-4, are formed. Each of divisions 204-1, 204-2, 204-3, and 204-4 in staircase 202-3 may be in contact with and conductively connected to a respective memory string in the first memory array structure (in the negative x-direction). Similarly, each of divisions 204-1, 204-2, 204-3, and 204-4 in staircase 202-6 may be in contact with and conductively connected to a respective memory string in the second memory array structure (in the positive x-direction). In various implementations, each division, 204-1, 204-2, 204-3, and 204-4, in staircases 202-3 and 202-6, may also be considered as part of the respective memory string.

For ease of illustration, in the examples of the present disclosure, the memory block corresponding to staircase structure 226 may include three memory fingers, which are further divided by SSG cut structure 210 into six memory strings. First, third, and fourth portions 206-1, 206-3, and 206-4 of bridge structure 206 may be conductively connected to (and/or in contact with) a first memory string in both the first and second memory array structures in the negative and positive x-directions. Second portion 206-2 of bridge structure 206 may be conductively connected to (and/or in contact with) a second memory string in the first memory array structure in the negative x-direction. Fifth portion 206-5 of bridge structure 206 may be conductively connected to (and/or in contact with) the second memory string in the second memory array structure in the positive x-direction. In some implementations, the first memory string and the second memory string, in first and/or second memory array structures, are conductively connected to a respective portion of bridge structure 206. In some implementations, the first memory string and the second memory string each overlaps with the respective portion of bridge structure 206. Each of divisions 204-1, 204-2, 204-3, and 204-4 in staircase 202-3 may respectively be in contact with and conductively connected to a third, a fourth, a fifth, and a sixth memory string in the first memory array structure (in the negative x-direction). Each of divisions 204-1, 204-2, 204-3, and 204-4 in staircase 202-6 may respectively be in contact with and conductively connected to the third, the fourth, the fifth, and the sixth memory string in the second memory array structure (in the positive x-direction). In some implementations, staircases 202-1 and 202-4 are referred to two sub-staircases of a staircase that conductively connected to the first memory string in first and second memory array structures 106-1 and 106-2. In some implementations, staircases 202-1 and 202-4 are conductively connected to the first memory string through the same portion of bridge structure 206 (e.g., 206-1, 206-3, and 206-4).

As shown in FIGS. 2A and 2B, word line contact 222-1 may be landed on each division of each stair in staircases 202-3 and 202-6 to control the operations of memory cells corresponding to the division. For example, the memory cells in the memory string of the same level can be controlled by the respective word line contact 222-1 landed on the division. When a voltage is applied on the division of a stair by word line contact 222-1, the electric current may flow from the respective word line contact 222-1 to the memory cells in the respective memory string (e.g., a respective one of the third, fourth, fifth, and sixth memory strings) at the respective level. The third, fourth, fifth, and sixth memory strings in the first memory array structure can thus be respectively controlled through word line contacts 222-1 and staircase 202-3. The third, fourth, fifth, and sixth memory strings in the second memory array structure can thus be respectively controlled through word line contacts 222-1 and staircase 202-6.

Word line contacts 222-2 may be landed on each stair of staircases 202-2 and 202-5 such that memory cells in the second string in the first memory array structure can be controlled through word line contacts 222-2 on staircase 202-2, and memory cells in the second string in the second memory array structure can be controlled through word line contacts 222-2 on staircase 202-5. In various implementations, because each stair of staircase 202-2 is conductively connected to second portion 206-2 of bridge structure 206 of the same level, at least one word line contact 222-2 can be landed on either side of both sides of slit structure 208-3 in the y-direction. Similarly, because each stair of staircase 202-5 is conductively connected to of fifth portion 206-5 of bridge structure 206 of the same level, at least one word line contact 222-2 can be landed on either side of both sides of slit structure 208-3 in the y-direction. The second memory string can thus be controlled through staircases 202-2 and 202-5, bridge structure 206 (i.e., the second and fifth portions 206-2 and 206-5 of bridge structure 206), and word line contacts 222-2.

Word line contacts 222-3 may be landed on stairs in staircases 202-1 and 202-4 to control the operations of memory cells in the first memory string of both first and second memory array structures. Because for each level, the stairs of both staircases 202-1 and 202-4 are conductively connected to the first memory string of both the first and second memory array structures, word line contact 222-3 can be landed on at least one of staircases 202-1 and 202-4. As an example, as shown in FIG. 2B, word line contacts 222-3 are formed on each stair (i.e., stair of each level) of only staircase 202-1. In another example, word line contacts 222-3 are formed on each stair of only staircase 202-4. In another example, word line contacts 222-3 are formed on both staircases 202-1 and 202-4, with at least one word line contact 222-3 on at least one stair of each level. In various implementations, for each level, at least one word line contact 222-3 is formed on one or both of staircases 202-1 and 202-4 such when a voltage is applied on a stair through a word line contact 222-3, the electric current may flow from the respective stair to the memory cells in the first memory string of both the first and second memory array structures at the respective level. In other words, the memory cells in the first string of both first and second memory array structures at the respective level can be controlled through the at least one word line contact 222-3, staircases 202-1 and/or 202-4, and bridge structure 206. In various implementations, because each stair of staircases 202-1 and 202-4 is conductively connected to bridge structure 206 of the same level, word line contact 222-3 can be landed on either side of both sides of slit structure 208-3 in the y-direction. The specific distribution of word line contacts 222-3 should not be limited by the implementations of the present disclosure. The first memory string can thus be controlled through staircases 202-1 and/or 202-4, bridge structure 206 (i.e., the first, third, and fourth portions 206-1, 206-3, and 206-4 of bridge structure 206).

In some implementations, each staircase 202-1, 202-2, 202-3, 202-4, 202-5, or 202-6 is a functional staircase used for landing interconnects (e.g., word line contacts). As shown in FIGS. 2A and 2B, compared to an existing 3D memory device (e.g., 3D memory device 600), the word line contacts (e.g., 222-2 and 222-3) for applying a voltage on memory strings (e.g., the first and second memory strings) conductively connected to bridge structure 206 are landed on different staircases from those on which the word line contacts (e.g., 222-1) for applying a voltage on memory strings conductively connected to the staircases (e.g., 202-3 and 202-6) are landed. Specifically, staircases 202-1 and 202-4 are dedicated for the conductive connection between word line contacts 222-3 and the first memory string, and staircases 202-2 and 202-5 are dedicated for the conductive connection between word line contacts 222-2 and the second memory string. The rest of the memory strings, e.g., the third, fourth, fifth, and six memory strings, are conductively connected to word line contacts 222-1 through staircases 202-3 and 202-6. Fewer divisions are formed in staircases 202-3 and 202-6. Also, the landing area for each word line contacts 222-1, 222-2, and 222-3 can be increased. The design and fabrication of SSG cut structure 210 can be less complex, and those of word line contacts 222-1, 222-2, and 222-3 can be less complex and more flexible. The control of memory strings conductively connected to bridge structure 206 may be easier. As shown in FIG. 2B, a region A represents an area of staircase structure 226 in which word line contacts (e.g., 222-1, 222-2, and 222-3) are formed for string control by SSG cut structure 210 (e.g., a BSG cut structure). Memory strings (e.g., the six memory strings) in contact with those word line contacts can be controlled separately to implement various operations such as read, write, and erase.

Optionally, as shown in FIG. 2B, 3D memory device 200 further includes a region C in staircase structure 226 in which a plurality of word line contacts 222-4 are formed on a plurality of stairs above the stairs and SSG cut structure 210. Region C may include a core region of 3D memory device 200. In some implementations, memory cells are formed in the core region. In some implementations, word line contacts 222-4 are formed in a top portion of staircase structure 226 to implement a bilateral word-line driving scheme for string control using a drain-select gate (DSG) cut structure, such as a top-select-gate (TSG) cut structure 230. DSG cut structure 230 can be formed in the top portion of staircase structure 226, extending in region C. Each memory block may be divided by the DSG cut structure into the same number of memory strings. In some implementations, DSG cut structure 230 includes a plurality of portions extending in the x-direction and is aligned with a respective SSG cut structure in the z-direction. Memory strings (e.g., the six memory strings) in contact with those word line contacts can be controlled separately to implement various operations such as read, write, and erase. 3D memory device 200 may further include a region B, which represents an area in staircase structure 226 in which the memory block is not divided and can be operated as a whole. Region B may be located between DSG cut structure 230 and SSG cut structure 210. The memory cells conductively connected to region B may be operated by block control.

In some implementations, SSG cut structure 210 includes a plurality of third portions 210-3, which is formed by the same dielectric material as SSG cut structure 210 and disconnect slit structures in the x-direction. A depth of third portion 210-3 may be the same as the rest of SSG cut structures 210. As shown in FIGS. 2A and 2B, third portion 210-3 may extend in the z-direction and between two adjacent memory strings (e.g., between the second and third memory strings and between the fourth and fifth memory strings). In some implementations, third portions 210-3 separate memory strings and memory fingers.

Figure 3A:
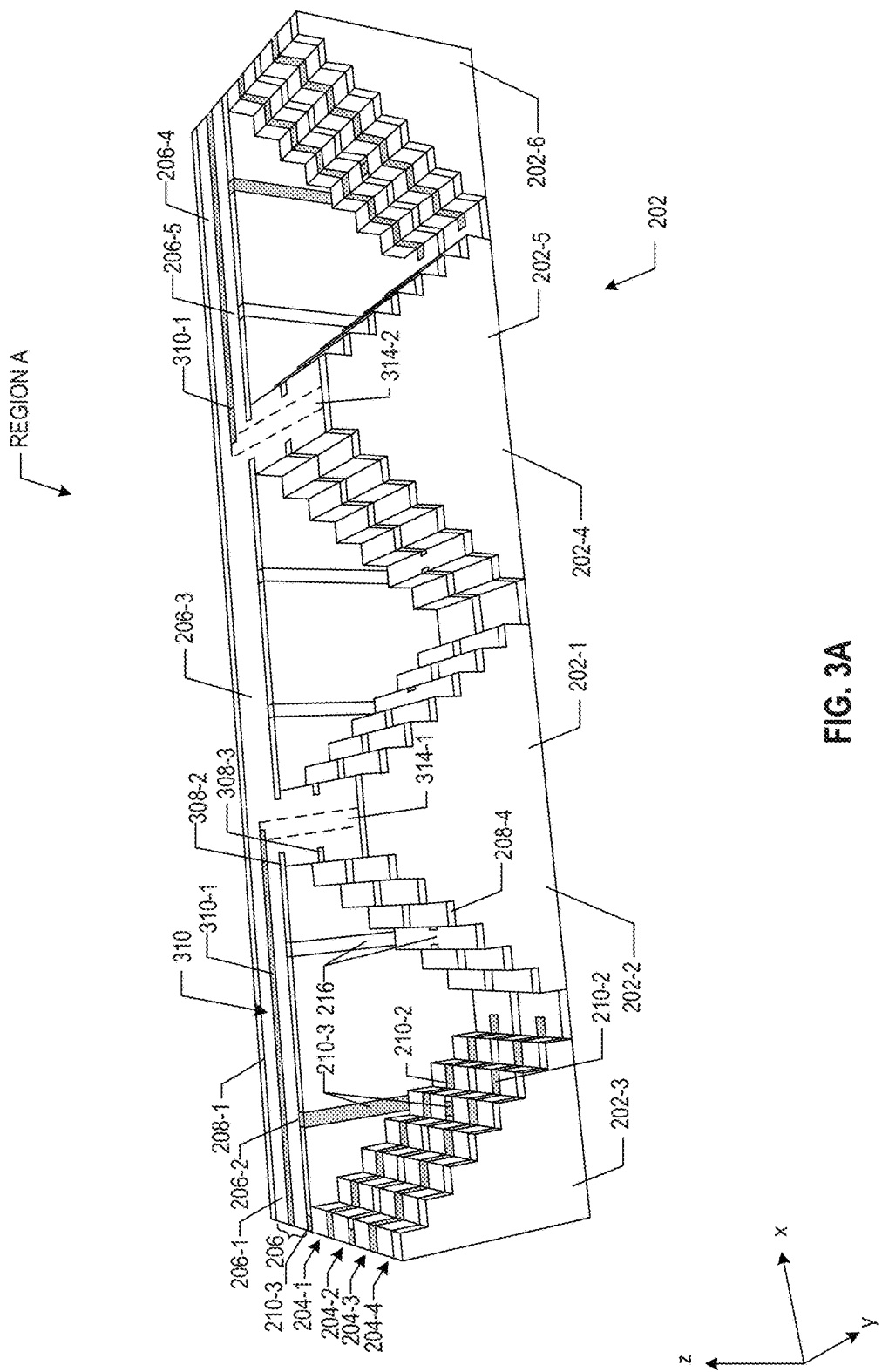
FIG. 3A illustrates a top front perspective view of another exemplary staircase structure having a SSG cut structure in a 3D memory device, according to some implementations of the present disclosure.
Figure 3B:
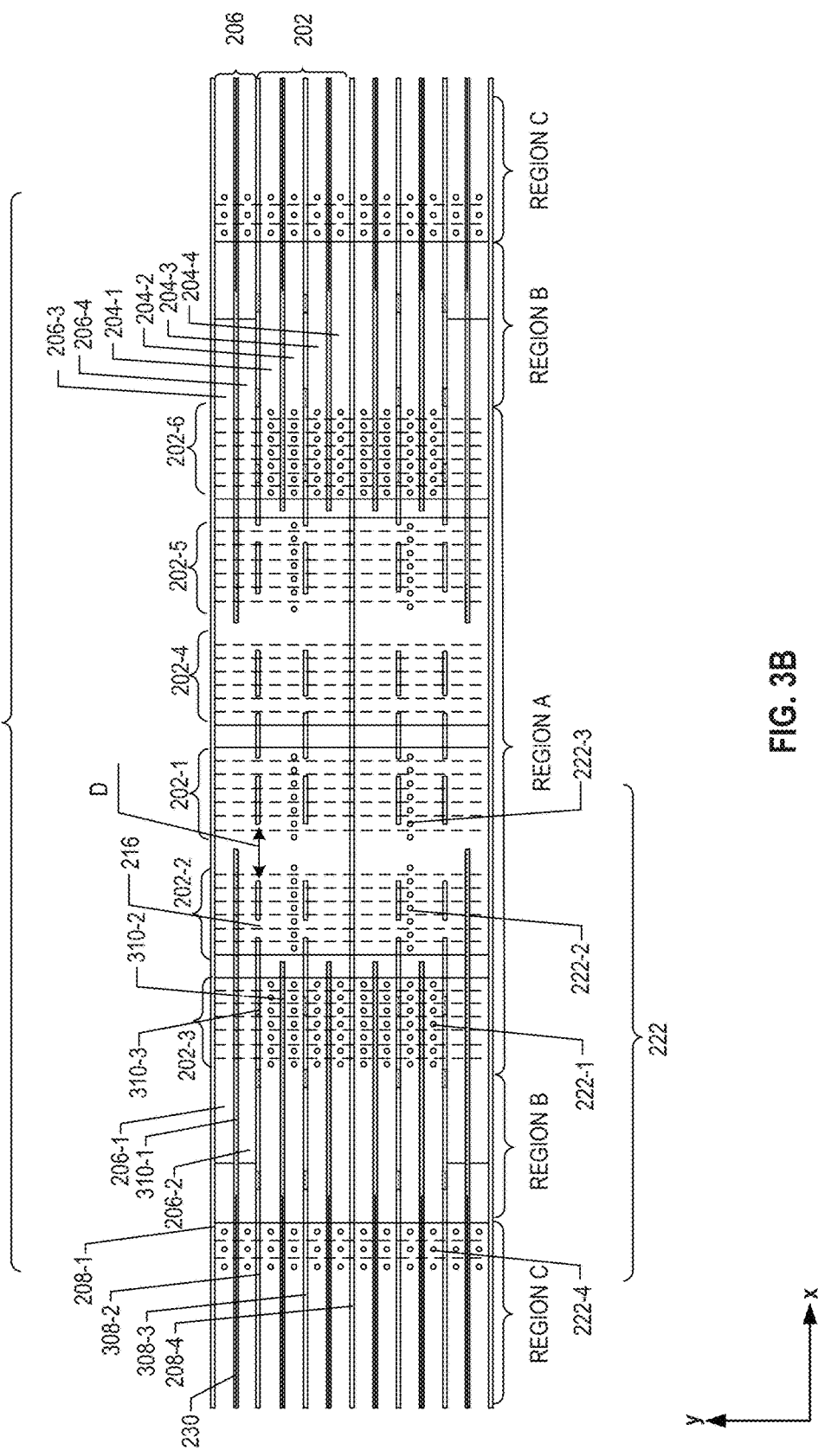
FIG. 3B illustrates a plan view of the exemplary 3D memory device in FIG. 3A.

FIG. 3A illustrates a top-front perspective view of an exemplary 3D memory device 300 having a staircase structure 326 with a SSG cut structure 310, according to some implementations of the present disclosure. FIG. 3B illustrates a top view of 3D memory device 300. 3D memory device 300 may be another example of part of memory plane 102 in FIG. 1 that includes staircase structure 104. Staircase structure 326 of 3D memory device 300 may be another example of staircase structure 104 in memory plane 102. For the simplicity of description, parts of 3D memory device 300 labeled with the same numerals are the same as or similar to those in 3D memory device 200, and the detailed descriptions are not repeated herein.

Different from staircase structure 226, staircase structure 326 may include SSG cut structure 310 of which first portions 310-1 do not extend in the y-direction to insulate/separate staircases 202-2 and 202-1, and staircases 202-4 and 202-5, respectively. For example, first portions 310-1 of SSG cut structure 310 do not extend beyond bridge structure 206 in the lateral plane (e.g., the x-y plane). Instead, staircase structure 326 may include a pair of insulating structures 314-1 and 314-2, respectively between staircases 202-2 and 202-1 and between staircases 202-4 and 202-5. Insulating structures 314-1 and 314-2 are shown in dashed lines in FIG. 3A. In some implementations, insulating structures 314-1 and 314-2 each extends in the z-direction and the y-direction and is in contact with the corresponding first portion 310-1 of SSG cut structure 310 such that staircase 202-2 is insulated from staircase 202-1, and staircase 202-4 is insulated from 202-5. In some implementations, as shown in FIG. 3B, first portions 310-1 of SSG cut structures 310 in the two adjacent staircase zones 202 are not in contact with each other in the y-direction.

Insulating structure 314-1 and 314-2 may each include interleaved a plurality of first dielectric layers and a plurality of second dielectric layers, stacking in staircase structure 326. In some implementations, insulating structures 314-1 and 314-2 may be in contact with the substrate. The first dielectric layers may be in contact with the conductive layers in adjacent staircases. For example, the first dielectric layers of insulating structure 314-1 may each be in contact with the conductive layers in staircases 202-2 and 202-1 of the same level, and the first dielectric layers of insulating structure 314-2 may each be in contact with the conductive layers in staircases 202-4 and 202-5 of the same level. The second dielectric layers may be in contact with the dielectric layers in adjacent staircases. For example, the second dielectric layers of insulating structure 314-1 may each be in contact with the dielectric layers in staircases 202-2 and 202-1 of the same level, and the second dielectric layers of insulating structure 314-2 may each be in contact with the dielectric layers in staircases 202-4 and 202-5 of the same level. The second dielectric layers may include the same materials as the dielectric layers in adjacent staircases. The first and second dielectric layers may include different materials. For example, the second dielectric layers may include silicon oxide, silicon oxynitride, and a combination thereof, and the first dielectric layers may include silicon nitride, polysilicon, carbon, or a combination thereof. In some implementations, the first dielectric layers include silicon nitride, and the second dielectric layers include silicon oxide. In some implementations, the dimensions of insulating structures 314-1 and 314-2 in the x-direction may each be sufficiently large to fully insulate the adjacent staircases. In some implementations, the dimensions of insulating structures 314-1 and 314-2 in the x-direction range from about 0.5 microns to about 1.5 microns, such as about 0.5, about 0.8, and about 1 micron.

Similar to slit structures 208-2 and 208-3 in staircase structure 226, in staircase structure 326, slit structures 308-2 and 308-3 are each disconnected in the x-direction and not in contact with insulating structures 314-1 and 314-2. In some implementations, as shown in FIG. 3B, in staircase structure 326 and in the x-direction, a lateral distance D between two disconnected portions of slit structure 308-2 and between two disconnected portions of slit structure 308-3 may be greater than that for slit structures 208-2 and 208-3 in staircase structure 226. In some implementations, lateral distance D is in a range of about 1 micron to about 4 microns, such as about 1 micron, about 1.5 microns, about 2 microns, about 2.5 microns, and about 3 microns. Lateral distance D is greater than the dimension of insulating structures 314-1 and 314-2 in the x-direction.

It should be noted that the proportions and dimensions of various structures in the figures of the present disclosure have been modified for ease of illustration of the implementations. For example, in FIGS. 2A, 2B, 3A, and 3B, each staircase may include a plurality of more stairs such that the number of levels/stairs in each staircase may be 32, 64, 96, 128, 256, etc. The proportion of each staircase, e.g., in the x-direction, is thus changed to depict the structures in the staircase structure in a more compact manner. Other structures, such as stairs over the stairs already shown, are omitted.

Figure 5:
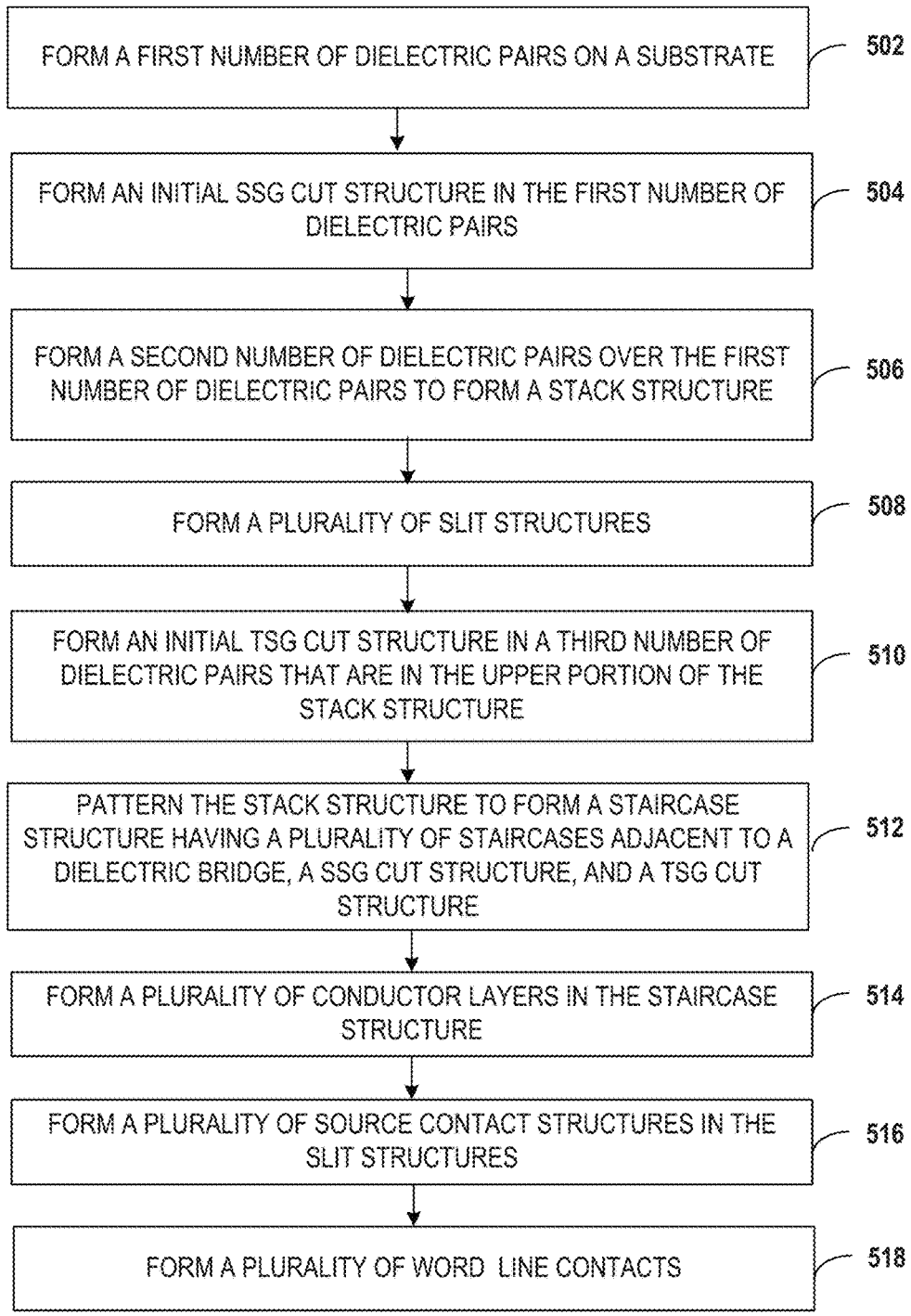
FIG. 5 is a flowchart of a method for forming exemplary staircase structures having SSG cut structures of a 3D memory device, according to some implementations.

FIG. 5 is a flowchart of a method 500 for forming an exemplary staircase structure of a 3D memory device (e.g., staircase structures 226 and 326), according to some implementations. It is understood that the operations shown in method 500 are not exhaustive and that other operations can be performed as well before, after, or between any of the illustrated operations. Further, some of the operations may be performed simultaneously, or in a different order than shown in FIG. 5. For ease of description, 3D memory devices 200 and 300 and method 500 are described together.

Figure 4A:
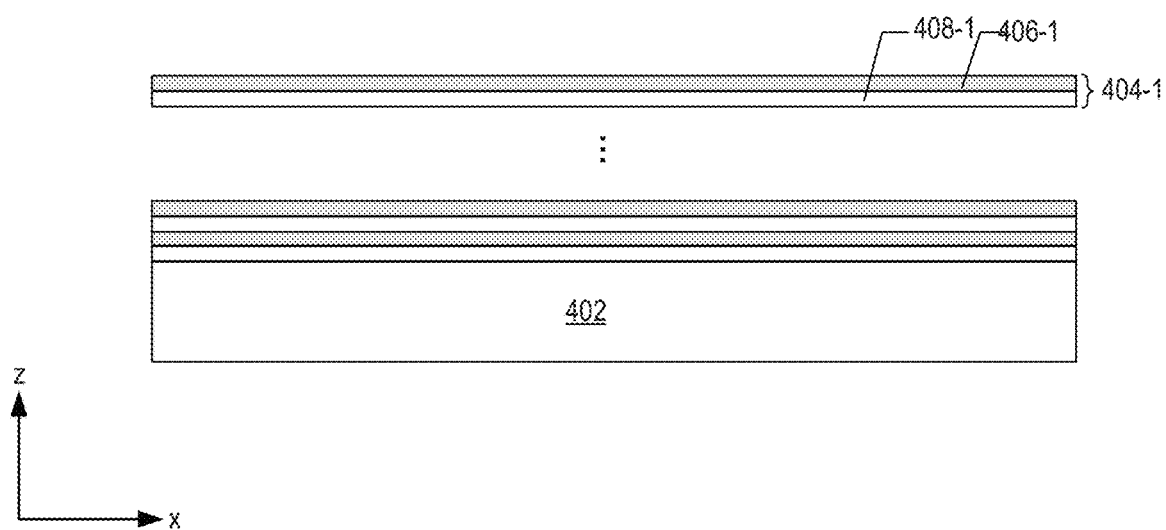
FIGS. 4A-4F illustrate a fabrication process for forming exemplary staircase structures having SSG cut structures of a 3D memory device, according to various implementations of the present disclosure.

Referring to FIG. 5, method 500 starts at operation 502, in which a first number of dielectric pairs are formed on a substrate. FIG. 4A illustrates a corresponding structure.

As shown in FIG. 4A, a first number of dielectric pairs 404-1 can be formed on a substrate 402. The first number of dielectric pairs 404-1 may include interleaved a plurality of sacrificial material layers 406-1 and a plurality of dielectric material layers 408-1, which are formed by alternatingly depositing layers of sacrificial material and layers of dielectric material along the z-direction over the substrate until a desired number of layers is reached. Dielectric pairs 404-1 may extend laterally in the x-direction and the y-direction. In some implementations, the first number is at least 2. In some implementations, the first number is six or seven. Sacrificial material layers 406-1 and dielectric material layers 408-1 can have the same or different thicknesses. In some implementations, each sacrificial material layer 406-1 and the underlying dielectric material layer 408-1 are together referred to as a dielectric pair 404-1. The number of dielectric pairs 404-1 may be determined by the depth/height of the subsequently-formed SSG cut structure (e.g., a BSG cut structure). For example, if the SSG cut structure is to be formed in the bottom seven pairs of conductive/dielectric layer pairs, seven (i.e., the first number of) dielectric pairs 404-1 may first be deposited on the substrate. In some implementations, each dielectric pair 404-1 can form one level/stair. In some implementations, sacrificial material layers 406-1 includes silicon nitride, and dielectric material layers 408-1 includes silicon oxide. The deposition of sacrificial material layers 406-1 and dielectric material layers 408-1 may each include one or more of chemical vapor deposition (CVD), physical vapor deposition (PVD), and atomic layered deposition (ALD).

Figure 4B:
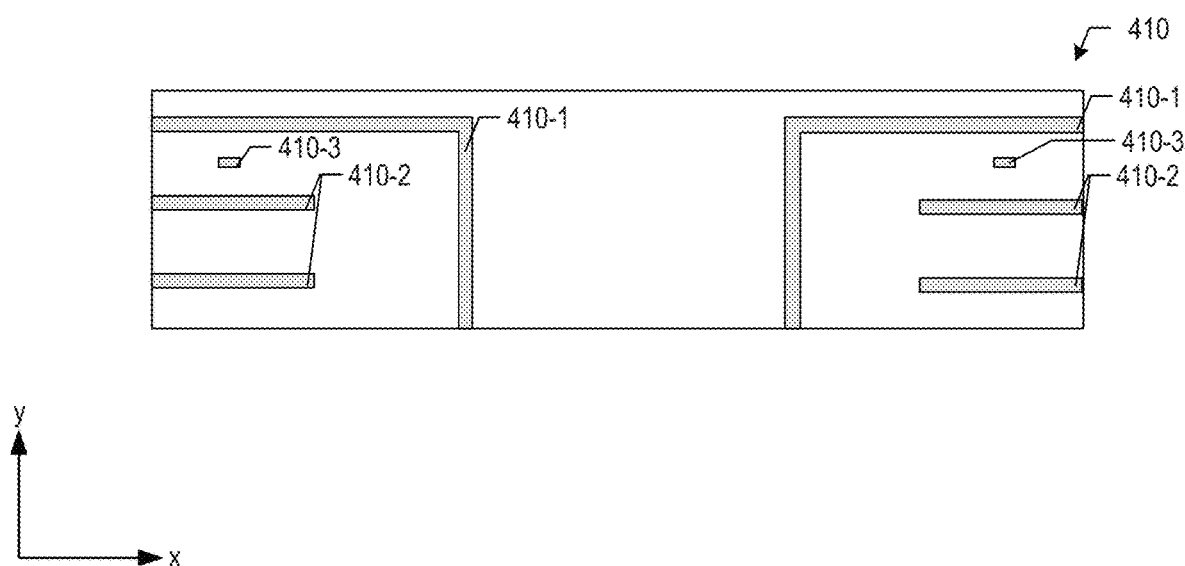
Figure 4C:
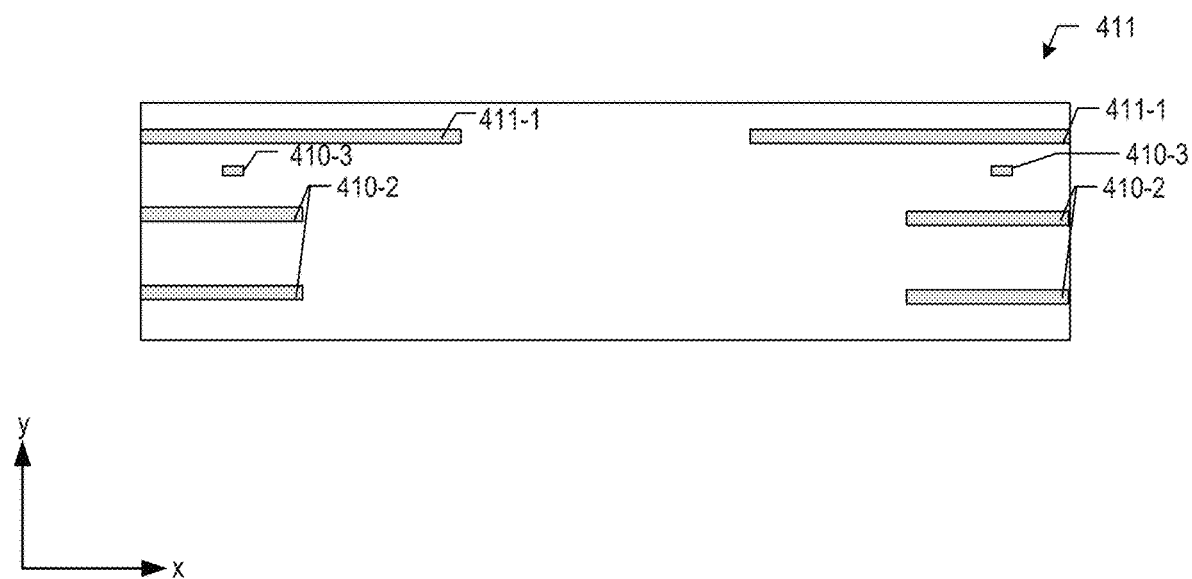

Referring back to FIG. 5, method 500 proceeds to operation 504, in which an initial SSG cut structure is formed in the first number of dielectric pairs. FIGS. 4B and 4C illustrate top views of the corresponding structures.

FIG. 4B illustrates the top view of the structure for forming 3D memory device 200, according to some implementations. As shown in FIG. 4B, the first number of dielectric pairs 404-1 may be patterned to form an initial SSG-cut structure 410, from which SSG cut structure 210 can be formed. Initial SSG cut structure 410 may extend in the x-direction in an array region and a staircase region of 3D device 200. Dielectric pairs 404-1 may be patterned to form trenches in which initial SSG cut structure 410 is formed. Referring back to FIGS. 2A and 2B, initial SSG cut structure 410 may include, in the staircase region, a plurality (e.g., a pair) of first portions 410-1, a plurality of second portions 410-2, and a plurality of third portions 410-3. First portions 410-1 may each extend in the x-direction and they-direction and may subsequently be patterned to form first portions 210-1. For example, the lateral parts of first portions 410-1 in the x-direction may be formed in a region in which a bridge structure (e.g., 206) is formed. The lateral parts of first portions 410-1 in they-direction may each be at a location adjacent to two adjacent staircases (e.g., 202-1 and 202-2, and 202-4 and 202-5) that are subsequently formed. Second portions 410-2 may extend in the x-direction and may be at locations that subsequently divide staircases (e.g., 202-3 and 202-6) into a plurality of divisions (referring back to divisions 204-1, . . . , 204-4). Third portions 410-3 may each be at a location that separates dielectric fingers and dielectric strings.

In some implementations, to form initial SSG cut structure 410, in the x-direction, a plurality of trenches are formed in the dielectric bridge in dielectric pairs 404-1 by removing portions of dielectric pairs 404-1 until substrate 402 is exposed. Some trenches, from which first portions 410-1 of initial SSG cut structure 410 are formed may divide the dielectric bridge into a first portion, a second portion, a third portion, a fourth portion, and a fifth portion. The first and second portions may be in the region adjacent to subsequently-formed staircases 202-2 and 202-3. The third portion may be in the region adjacent to subsequently-formed staircases 202-1 and 202-4. The fourth and fifth portions may be in the region adjacent to subsequently-formed staircases 202-4 and 202-6. The third portion may be in contact with the first and fourth portions of the dielectric bridge. In some implementations, the first and fourth portions of the dielectric bridge are both coupled to the first dielectric string in the first and second dielectric structures. In some implementations, the second portion of the dielectric bridge is coupled to the second dielectric string in the first dielectric structure, and the fifth portion of the dielectric bridge is coupled to the second dielectric string in the second dielectric structure. Also, in the y-direction, a pair of trenches are formed. One of the trenches is between the subsequently-formed staircases 202-1 and 202-2, and the one of the trenches is between the subsequently-formed staircase 202-4 and 202-5. Each of these trenches may be in contact with a respective trench in the x-direction.

FIG. 4C illustrates the top view of the structure for forming 3D memory device 300, according to some implementations. As shown in FIG. 4C, the first number of dielectric pairs 404-1 may be patterned to form an initial SSG cut structure 411, from which SSG cut structure 310 can be formed. Referring back to FIGS. 3A and 3B, initial BSG-cut structure 411 may include a pair of first portions 411-1, a plurality of second portions 410-2, and a plurality of third portions 410-3. Different from initial BSG-cut structure 410, first portions 411-1 of initial BSG-cut structure 411 may not extend along they-direction. First portions 310-1 of SSG cut structure 310 may be formed from first portions 411-1 of initial SSG cut structures 411. In some implementations, to form initial SSG cut structure 411, in the y-direction, trenches between the subsequently-formed staircases 202-1 and 202-2, and between the subsequently-formed staircase 202-4 and 202-5 are not formed.

The formation of initial BSG-cut structures 410 and 411 may each include patterning dielectric pairs 404-1 to form the trenches described above. A suitable dielectric material, such as silicon oxide, may be deposited to fill the openings. The etching of dielectric pairs 404-1 may include a suitable etching process, e.g., dry etch and/or wet etch, following a photolithography process. The deposition of the dielectric material may include one or more of CVD, PVD, and ALD. Optionally, a planarization process can be performed after the deposition of the dielectric material to remove any excess materials on dielectric pairs 404-1. The planarization process may include a recess etch and/or a chemical mechanical polishing (CMP).

Figure 4D:
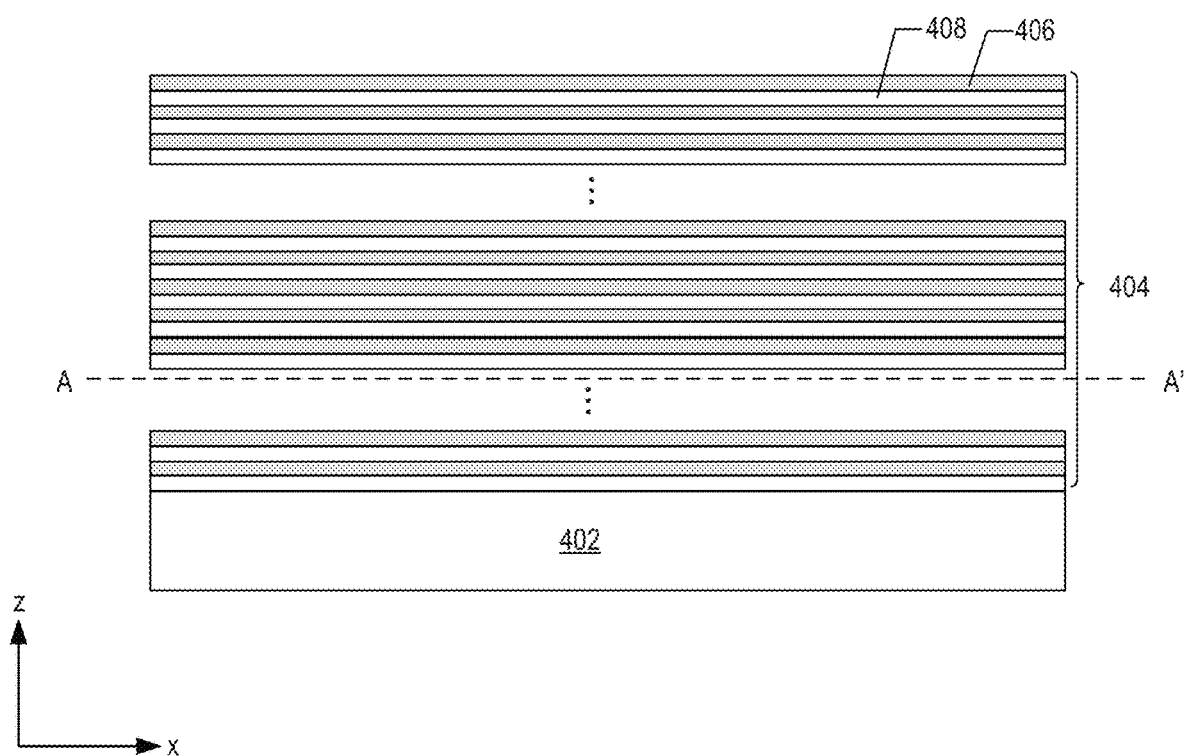

Referring back to FIG. 5, method 500 proceeds to operation 506, in which a second number of dielectric pairs are formed over the first number of dielectric pairs to form a stack structure. FIG. 4D illustrates a corresponding structure.

As shown in FIG. 4D, a second number of dielectric pairs may be formed over the first number of dielectric pairs 404-1, forming a stack structure 404. The second number of dielectric pairs may include interleaved a plurality of sacrificial material layers and a plurality of dielectric material layers, which are formed by alternatingly depositing layers of sacrificial material and layers of dielectric material along the z-direction over the first number of dielectric pairs until a desired number of layers is reached. The sacrificial material layers and dielectric material layers in the second number of dielectric pairs may respectively be the same as those in the first number of dielectric materials. The deposition methods of the second number of dielectric pairs may include one or more of CVD, PVD, and ALD. The number of dielectric pairs in stack structure 404 may be equal to the total number of conductive/dielectric layer pairs that are subsequently formed, e.g., 32, 64, 96, 128, 256, etc. In stack structure 404, all the sacrificial material layers are depicted as 406, and all the dielectric material layers are depicted as 408.

Figure 4E:
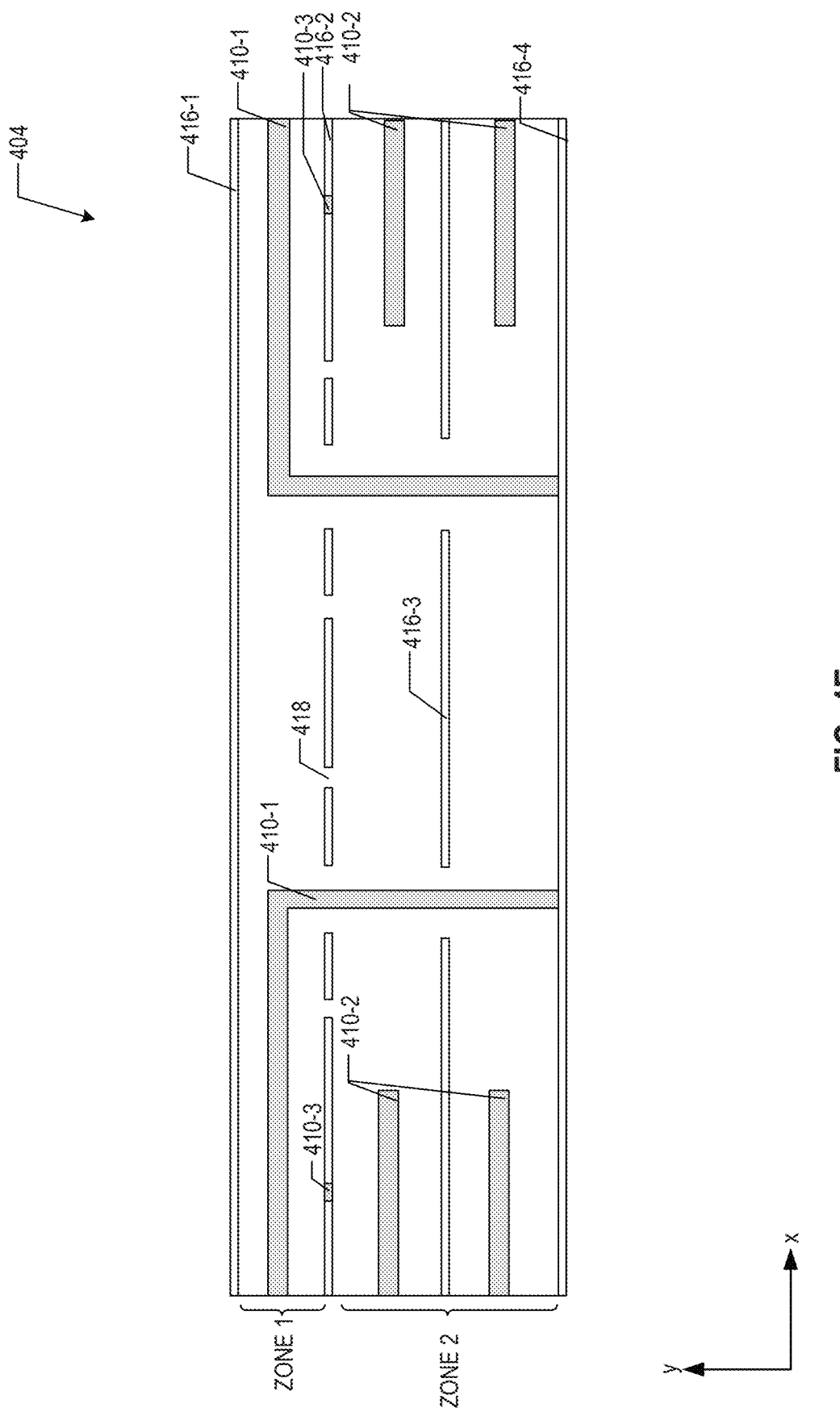

Referring back to FIG. 5, method 500 proceeds to operation 508, in which a plurality slit structures are formed in the stack structure. FIGS. 4D and 4E illustrate corresponding structures. Specifically, FIGS. 4E and 4F are each a top view along the A-A' plane (e.g., a lateral plane) in the stack structure.

FIG. 4E shows the layout of slit structures 416-1, 416-2, 416-3, and 416-4 in stack structure 404 in which SSG cut structure 210 is subsequently formed. As shown in FIG. 4E, slit structures 416-1, 416-2, 416-3, and 416-4 may each extend in the x-direction and z-direction in stack structure 404. Slit structures 416-1 and 416-4 may extend continuously in the x-direction and the portion of stack structure 404 between slit structures 416-1 and 416-4 are conductively connected to (or being a part of) a dielectric block of stack structure 404. Slit structure 416-2 may divide this portion of stack structure 404 into zone 1 and zone 2. The portion of stack structure 404 in zone 1 may form a dielectric bridge, and a staircase zone (e.g., 202) may be subsequently formed in zone 2. Specifically, in subsequent fabrication processes, a bridge structure (e.g., bridge structure 206) may be formed from the dielectric bridge in zone 1, and a plurality of staircases may be formed in zone 2. Slit structure 416-3 may extend in zone 2 in which staircases 202-1, 202-2, 202-3, 202-4, 202-5, and 202-6 are subsequently formed, referring back to FIGS. 2A and 2B. In some implementations, slit structure 416-3 is positioned at the middle position in the y-axis in zone 2. Slit structures 416-2 and 416-3 may each be disconnected into a plurality of portions in the x-direction and include a plurality of cuts. In some implementations, slit structures 416-2 and 416-3 are disconnected such that portions of slit structures 416-2 and 416-3 have no contact with first portions 410-1 (i.e., the lateral parts of first portions 410-1 in they-direction) of initial SSG cut structure 410. In some implementations, slit structure 416-2 includes cuts 418, extending in the z-direction and in which passage structures 216 are subsequently formed. In some implementations, slit structure 416-2 includes cuts in which third portions 410-3 of initial SSG cut structure 410 are located. Slit structures 416-1, 416-2, 416-3, and 416-4, and initial SSG cut structure 410 may divide the lower portion of stack structure 404 into a plurality of dielectric strings in the positive x-direction and negative x-direction.

Figure 4F:
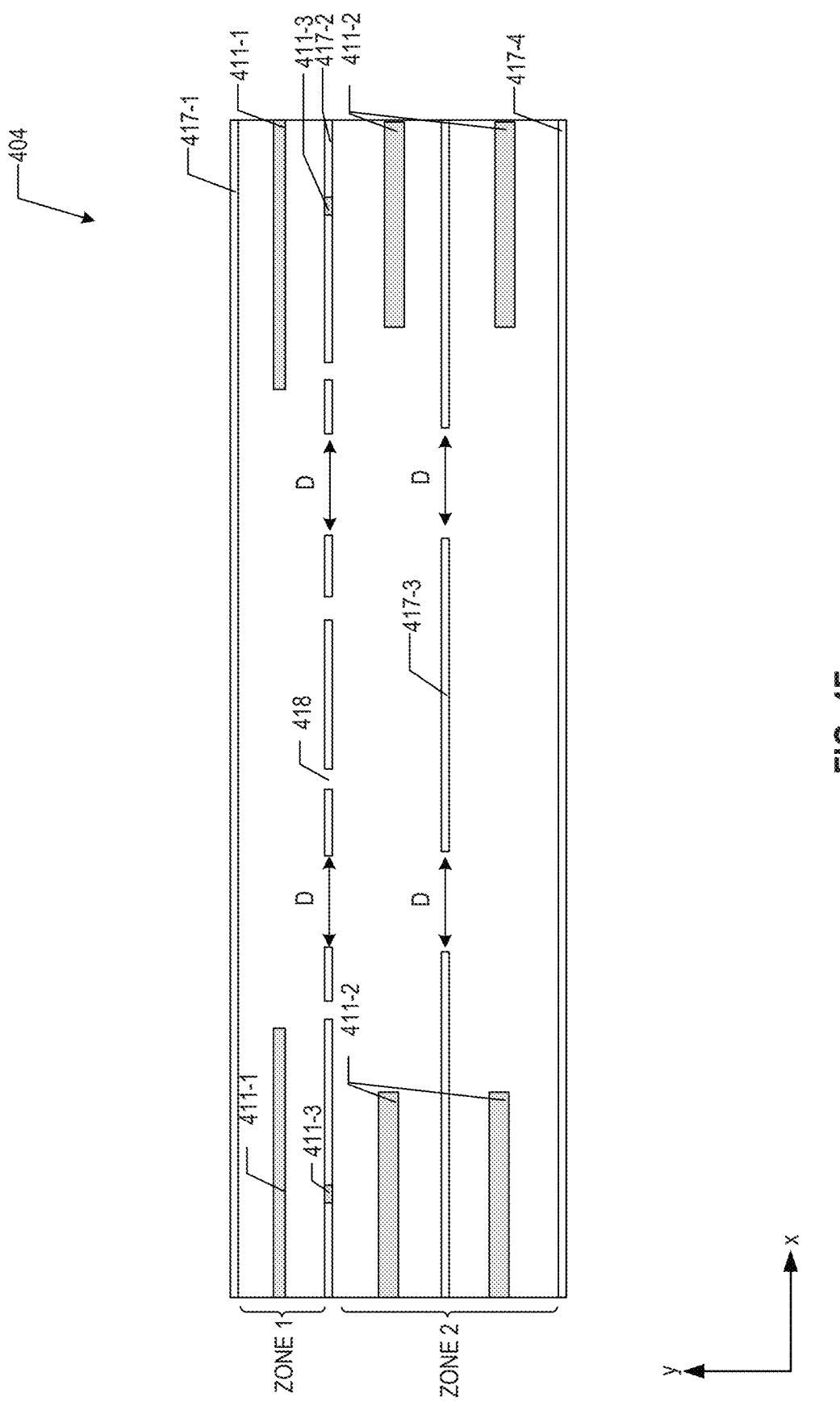

FIG. 4F shows the layout of slit structures 417-1, 417-2, 417-3, and 417-4 in stack structure 404 in which SSG cut structure 310 can be subsequently formed. Slit structures 417-1 and 417-2 may be the same as slit structures 416-1 and 416-2. Different from slit structures 416-2 and 416-3, the lateral distances D between portions of slit structures 417-2 and 417-3 in the regions between subsequently-formed staircases 202-2 and 202-1 and between subsequently-formed staircases 202-4 and 202-5 are sufficiently large such that a sufficient amount of dielectric materials (i.e., the interleaved sacrificial material layers 406 and dielectric material layers 408) can be retained in the subsequent gate-replacement process. The retained dielectric materials can form insulating structures 314-1 and 314-2 that are in contact with first portions 310-1 and 310-2, respectively, to insulate/separate electric current in staircases 202-1 and 202-2 and in staircases 202-4 and 202-5. Slit structures 417-1, 417-2, 417-3, and 417-4, and initial SSG cut structure 411 may divide the lower portion of stack structure 404 into a plurality of dielectric strings in the positive x-direction and negative x-direction.

The slit structures 416-1, 416-2, 416-3, 416-4, 417-1, 417-2, 417-3, and 417-4 may be formed by patterning stack structure to form a plurality of openings with the patterns of these slit structures. In some implementations, the patterning process includes a suitable dry etch and/or wet etch, which can be performed after a photolithography process.

Referring back to FIG. 5, optionally, method 500 proceeds to operation 510, in which an initial TSG cut structure is formed in the upper portion of the stack structure.

Optionally, an initial TSG cut structure (not shown) is formed in the upper portion of stack structure 404. The initial TSG cut structure may include a dielectric material, such as silicon oxide, and may be formed in one or more dielectric pairs in the upper portion of stack structure 404. In some implementations, the initial TSG cut structure extends in the x-direction in the positive and negative x-directions of zone 1 and zone 2 of stack structure 404. In some implementations, the initial TSG cut structure, along with the slit structures (e.g., 416-1, . . . , 416-4, or 417-1, . . . , 417-4) may include a plurality of portions that divide the upper portion of stack structure 404 into a plurality of dielectric strings in the positive x-direction and negative x-direction. In some implementations, the initial TSG cut structure at least partially overlaps with the initial SSG-cut structure (e.g., 410 or 411) in the z-direction in stack structure 404 and the dielectric strings in the upper and lower portions of stack structures 404 at least partially overlap with each other in the positive x-direction and negative x-direction.

The formation of the initial TSG cut structures may include patterning stack structure 404 and removing portions of dielectric pairs 406/406 in the upper portion of stack structure 404 until a desired depth is reached, forming a plurality of openings. A suitable dielectric material, such as silicon oxide, may be deposited to fill the openings. The etching of dielectric pairs 406/408 may include a suitable etching process, e.g., dry etch and/or wet etch, following a photolithography process. The deposition of the dielectric material may include one or more of CVD, PVD, and ALD. Optionally, a planarization process can be performed after the deposition of the dielectric material to remove any excess materials on stack structure 404. The planarization process may include a recess etch and/or a chemical mechanical polishing (CMP).

Referring back to FIG. 5, method 500 proceeds to operation 512, in which the stack structure is patterned to form a staircase structure having a plurality of staircases adjacent to a dielectric bridge. The stack structure also includes an SSG cut structure. Optionally, the stack structure also includes a TSG cut structure.

Stack structure 404 may be patterned to form a first dielectric structure, a second dielectric structure, a staircase structure in the intermediate of the first and second dielectric structures, and the SSG cut structure in the staircase structure. The SSG cut structure may also extend in the first and second dielectric structures. The staircase structure may include a dielectric bridge and a staircase zone, which includes a plurality of staircases. Referring back to FIGS. 2A, 2B, 3A, and 3B, a plurality of staircases (e.g., staircases 202-1, . . . , 202-6) may be formed in the x-direction and adjacent to the dielectric bridge, which may subsequently form a bridge structure. Referring back to FIGS. 4E and 4F, the staircases may be formed in zone 2, and the dielectric bridge may be formed in zone 1. The first and second dielectric structures may subsequently form the first and second memory array structures, respectively.

The staircase structure can be formed by patterning the portion of stack structure 404 in zone 2 to form the plurality of staircases (e.g., staircases 202-1, . . . , 202-6) in the x-direction. Each staircase may include a plurality of stairs. The staircase structure can be formed by repetitively patterning stack structure 404 in zone 2, which includes the plurality of dielectric pairs 406/408, using an etch mask, e.g., a patterned PR layer over stack structure 404. In some implementations, one or more dielectric pairs can form one level/staircase. During the formation of the staircase structure, the PR layer is trimmed (e.g., etched incrementally and inwardly in the x-direction) and used as the etch mask for etching the exposed portion of stack structure 404. The amount of trimmed PR can be directly related (e.g., determinant) to the dimensions of the staircases. The trimming of the PR layer can be obtained using a suitable etch, e.g., an isotropic dry etch and/or a wet etch. One or more PR layers can be formed and trimmed consecutively for the formation of the staircase structure. Each dielectric pair can be etched, after the trimming of the PR layer, using suitable etchants to remove a portion of both sacrificial material layer 406 and the underlying dielectric material layer 408. The etching of stack structure 404 may include a suitable dry etch and/or wet etch. The etched sacrificial material layers 406 and dielectric material layers 408 may form a plurality of sacrificial layers and dielectric layers in zone 2. The PR layer can then be removed.

In zone 2, the plurality of staircases (e.g., staircases 202-1, . . . , 202-6) may be formed after the patterning of stack structure 404. Each stair may include one or more pairs of sacrificial/dielectric layer pairs. In some implementations, each stair includes one pair of sacrificial/dielectric layer pairs. After the patterning process, a TSG cut structure may be formed from the initial TSG cut structure, and a SSG cut structure (e.g., 210 or 310) may be formed from the initial SSG cut structure. In some implementations, the SSG-cut structure is formed by the etched initial SSG cut structure. The divisions formed by the initial BSG-cut structure (e.g., 410-2 or 411-2) and/or the slit structure (e.g., 416-3 or 417-2) may be retained in the respective staircases in zone 2.

In zone 1, sacrificial material layers 406 and dielectric material layers 408 may be retained, respectively forming the sacrificial layers and dielectric layers. The interleaved sacrificial layers and dielectric layers in zone 1 may form the dielectric bridge. In some implementations, in some staircases (e.g., staircases to form 202-2, 202-1, 202-4, and 202-5), the dielectric layers are each in contact with dielectric layers of the same levels in the dielectric bridge, and the sacrificial layers are each in contact with sacrificial layers of the same levels in the dielectric bridge.

In some implementations, the plurality of staircases include a first staircase and a second staircase each coupled to a first dielectric string in the first and second dielectric structures through the dielectric bridge. In some implementations, the plurality of staircases also include a third staircase coupled to a second dielectric string in the first dielectric structure through the dielectric bridge, and a fourth staircase coupled to the second dielectric string in the second dielectric structure through the dielectric bridge. In some implementations, the plurality of staircases further include a fifth staircase coupled to a plurality of third dielectric strings in the first dielectric structure, and a sixth staircase coupled to the plurality of third dielectric strings in the second dielectric structure. The coupling between a staircase and a dielectric string may become conductive after conductive layers are formed in the staircase, the dielectric string (which becomes memory string), and the dielectric bridge (which becomes the bridge structure). In some implementations, first number of dielectric pairs 404-1 may be patterned to form stairs before the deposition of the second number of dielectric pairs. The second number of dielectric pairs may be patterned to form stairs after first number of dielectric pairs 404-1 are patterned.

Referring back to FIG. 5, method 500 proceeds to operation 514, in which a plurality conductive layers are formed in the staircase structure.

As described earlier, a plurality of conductive layers may be formed in the dielectric bridge and the staircases. The conductive layers may also be formed in the same fabrication process in the rest of stack structure 404 in the positive x-direction and negative x-direction. A gate-replacement process may be performed to form the conductive layers. In some implementations, an isotropic etching process may be performed, through the slit structures (416-1, . . . , 416-4 or 417-1, . . . , 417-4), to remove the sacrificial layers in the dielectric bridge, the staircases, and the rest of stack structure 404 in stack structure 404, to form a plurality of lateral recesses. A suitable conductor material, e.g., W, may be deposited to fill the lateral recesses to form the conductive layers in the dielectric bridge, the staircases, and the rest of stack structure 404. Stack structure 404 may include a memory stack that includes a memory array structure, i.e., a first memory array structure in the positive x-direction and a second memory array structure in the negative x-direction. The dielectric bridge may form a bridge structure (e.g., 206) that is conductively connected to the first and second memory strings in the memory array structure and some of the staircases (e.g., 202-2, 202-1, 202-4, and 202-5). The rest of the staircases (e.g., 202-3 and 202-6) may be conductively connected to the four memory strings in the memory array structure. Cuts 418 may each form a passage structure (e.g., 216) that conductively connect the bridge structure and the adjacent staircase (e.g., 202-2, 202-1, 202-4, and/or 202-5). The conductor material may be deposited by a suitable deposition method such as CVD, ALD, PVD, or a combination thereof.

It should be noted that the formation of staircase structure 226 and 326 are different, in some implementations. To form staircase structure 226, sacrificial layers in zone 1 and zone 2 may be fully removed before the conductor material is deposited. To form staircase structure 326, a portion of the dielectric materials between staircases 202-1 and 202-2 and between staircases 202-4 and 202-5 may each be retained to form an insulating structure (e.g., 314-1 and 314-2) respectively in contact with first portions (e.g., 310-1) of the SSG cut structure (e.g., 310). To form the insulating structure, a portion of the interleaved dielectric layers and sacrificial layers between staircases 202-1 and 202-2 and between staircases 202-4 and 202-5 may be retained. In some implementations, the isotropic etching process may be controlled to allow a sufficient amount of dielectric materials to be retained. For example, the isotropic etching can be timed. In some implementations, lateral distance D is sufficiently large to prevent a desired amount of dielectric materials between the two back-t-back staircases to be etched away.

Referring back to FIG. 5, method 500 proceeds to operation 516, in which a plurality of source contact structures are formed in the slit structures.

A plurality of source contact structures may be formed in the slit structures (416-1, . . . , 416-4, or 417-1, . . . , 417-4). An insulating spacer may be formed in each of the slit structures, and a source contact may be formed in the insulating spacer. In some implementations, the insulating spacer may undergo a recess etch to expose the substrate such that the source contact may be conductively connected to the source of the 3D memory device through the substrate. In some implementations, the insulating spacer includes silicon oxide, and the deposition of the insulating spacer includes CVD, PVD, ALD, or a combination thereof. In some implementations, the source contacts include W, and the deposition of the source contacts includes CVD, PVD, ALD, or a combination thereof.

Referring back to FIG. 5, method 500 proceeds to operation 518, in which a plurality of word line contact are formed.

A plurality of word line contacts are formed to be in contact with a respective landing area on the staircases in zone 2. In some implementations, an insulator structure is formed over the staircases (e.g., 202-1, . . . , 202-6), and the word line contacts are formed in the insulator structure. The staircases may be positioned in the insulator structure. In some implementations, the insulator structure includes silicon oxide, and the deposition of the insulator structure includes CVD, PVD, ALD, or a combination thereof. The word line contacts may be formed by patterning the insulator structure to form a plurality of openings that correspond to the locations of the word line contacts. A suitable conductive material may be deposited to fill the openings and form the word line contacts. In some implementations, the patterning of the insulator structure includes a suitable dry etch and/or wet etch. In some implementations, the word line contacts include W, and the deposition of the word line contacts includes CVD, PVD, ALD, or a combination thereof.

Figure 7A:
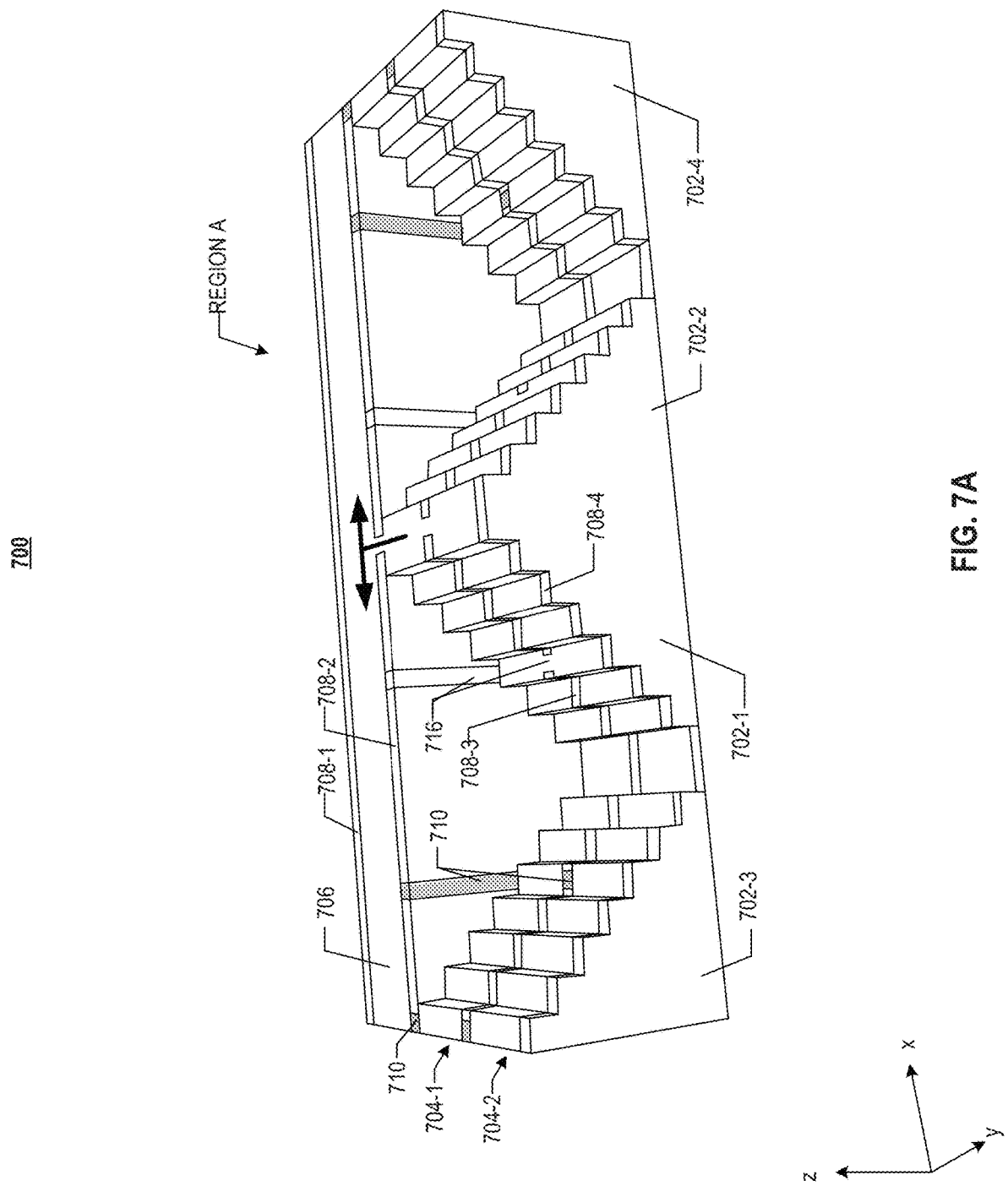
FIG. 7A illustrates a top front perspective view of another exemplary staircase structure having a SSG cut structure in a 3D memory device, according to some implementations of the present disclosure.
Figure 7B:
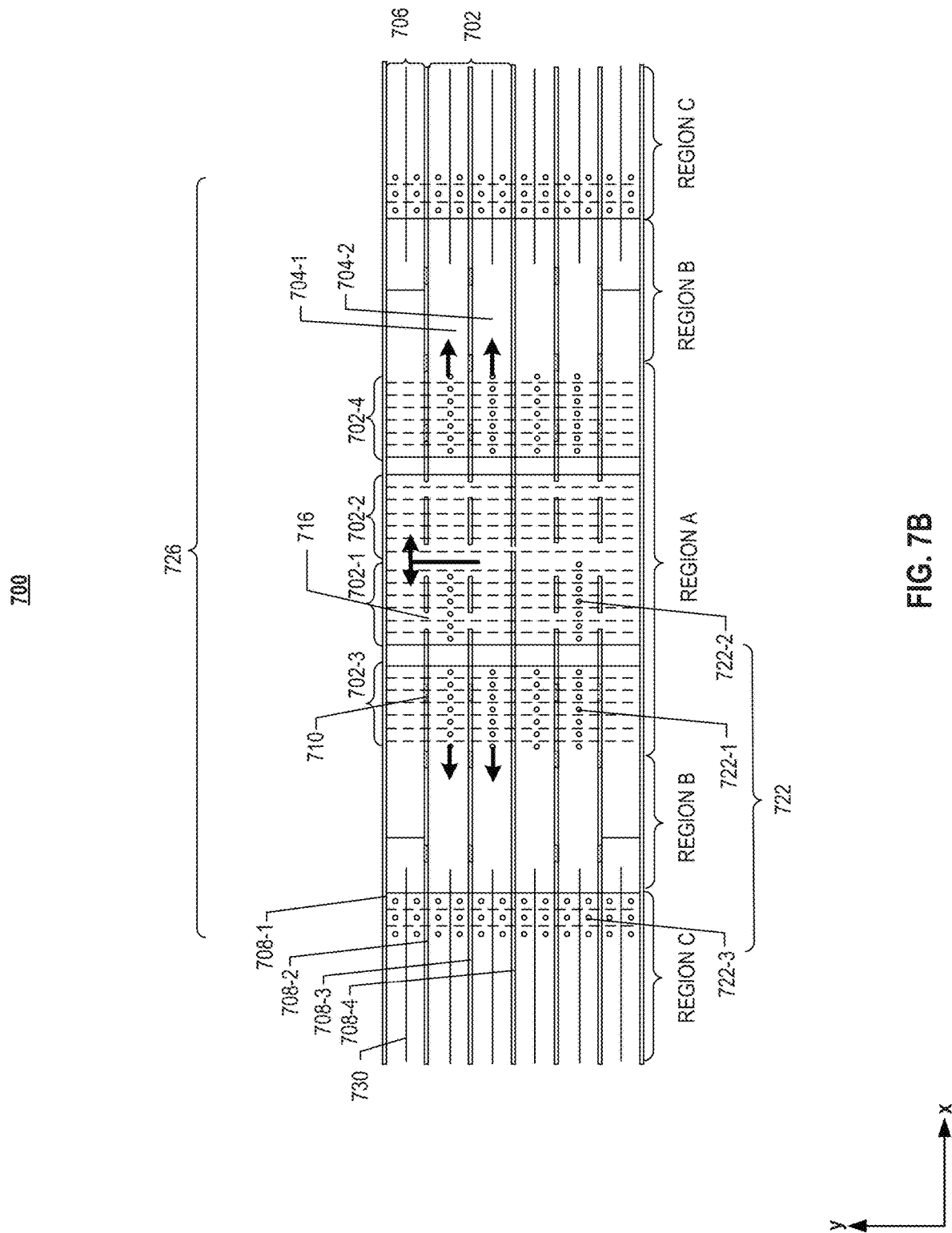
FIG. 7B illustrates a plan view of the exemplary 3D memory device in FIG. 7A.

FIG. 7A illustrates a top-front perspective view of an exemplary 3D memory device 700 having a staircase structure 726 with a SSG cut structure 710, according to some implementations of the present disclosure. FIG. 7B illustrates a top view of 3D memory device 700. 3D memory device 700 may be one example of part of memory plane 102 in FIG. 1 that includes staircase structure 104. Staircase structure 726 of 3D memory device 700 may be one example of staircase structure 104 in memory plane 102. For illustrative purposes, FIG. 7A shows staircase structure 726 corresponding to one memory block in memory array structure 106-1/106-2, which is the upper half of the structure shown FIG. 7B (in the y-direction). Staircase structure 726 may be conductively connected to memory cells in the memory block in memory array structures 106-1/106-2 or may be considered part of the memory block. FIG. 7B shows a pair of staircase structures 726 symmetrical to each other in the y-direction. For ease of explanation, FIGS. 7A and 7B are described together.

As shown in FIGS. 7A and 7B, staircase structure 726 may include a bridge structure 706 adjacent to a staircase zone 702. Bridge structure 706 may be conductively connected to (or considered as part of) a first memory finger in the memory array structures. Staircase zone 702 may be conductively connected to (or considered as part of) at least one second memory finger in the memory array structure. In some implementations, the memory finger conductively connected to bridge structure 706 overlaps with bridge structure 706 in the z-direction. Bridge structure 706 may include a plurality of conductive layers and a plurality of dielectric layers interleaved in the z-direction, similar to bridge structure 206. Staircase zone 702 may include a plurality of staircases, with at least one staircase being conductively connected to the first memory finger in each of the first and second memory array structures through bridge structure 706. The at least one staircase may be dedicated for providing the landing area for the word line contacts for controlling the first memory finger. In some implementations, staircase zone 702 includes a staircase 702-1 and a staircase 702-2 facing away from each other in the x-direction, e.g., stairs of staircase 702-1 faces the negative x-direction and stairs of staircase 702-2 faces the positive x-direction. Staircases 702-1 and 702-2 may be conductively to each other by the conductive layers of each level. Staircases 702-1 and 702-2 may also be conductively connected to bridge structure 706 and the first memory finger. Staircase zone 702 may also include at least one, e.g., a pair of, staircases 702-3 and 702-4 insulated from bridge structure 706 and staircases 702-1 and 702-2. In some implementations, staircase 702-3 is facing staircase 702-1 (e.g., stairs of staircases 702-1 and 702-3 facing inwardly towards opposite directions), and staircase 702-4 is facing staircase 702-2 (e.g., stairs of staircases 702-2 and 702-4 facing inwardly towards opposite directions). Staircase 702-3 may be conductively connected to one or more second memory fingers in the first memory array structure, and staircase 702-4 may be conductively connected to one or more second memory fingers in the second memory array structure. In some implementations, 3D memory device 700 includes a plurality of DSG cut structures 730, e.g., TSG cut structures, in an upper portion of staircase structure 726. DSG cut structure 730 may be in a core region of 3D memory device 700 and may insulate memory strings in each memory finger, similar to that of DSG cut structure 230. The detailed description is thus not repeated herein.

In some implementations, each staircase (702-1, 702-2, 702-3, and 702-4) includes interleaved a plurality of conductive layers and a plurality of dielectric layers in a plurality of stairs. Each staircase (702-1, 702-2, 702-3, and 702-4) may include one or more conductive/dielectric layer pairs in the z-direction. Conductive layers of the same levels in staircases 702-1 and 702-2 are in contact with each other and are further in contact with the conductive layers of the same levels in bridge structure 706. Conductive layers in staircase 702-3 are in contact with conductive layers of the same levels in the one or more second memory fingers in the first memory array structure. Conductive layers in staircase 702-4 are in contact with conductive layers of the same levels in the one or more second memory fingers in the second memory array structure. The structures and materials of staircases 702-1, 702-2, 702-3, and 702-4 may be similar to those of staircases 202-1, 202-2, 202-3, 202-4, 202-5, and 202-6, and the detailed description is not repeated herein.

3D memory device 700 may also include a plurality of slit structures 708 extending in the x-direction and dividing the memory array structure into a plurality of memory fingers in the y-direction. In some implementations, staircase structure 726 may be located between slit structures 708-1 and 708-4. In some implementations, a slit structure 708-2 is located between bridge structure 706 and staircase zone 702, and a slit structure 708-3 divides staircases 702-3 and 702-4 into two divisions 704-1 and 704-2 such that staircase 702-3 may be conductively connected to two second memory fingers in the first memory array structure through respective divisions 704-1 and 704-2, and staircase 702-4 may be conductively connected to the two second memory fingers in the second memory array structure through respective divisions 704-1 and 704-2. In some implementations, a source contact structure is formed in each slit structure 704-1, 704-2, 704-3, and 704-4. The structures, materials, and locations of slit structures 708 and the source contact structures may be similar to slit structures 208 and the respective source contact structures, and the detailed description is not repeated herein.

SSG cut structure 710 may include a dielectric material such as silicon oxide, silicon nitride, and/or silicon oxynitride. SSG cut structure 710 may isolate adjacent memory fingers. In some implementations, SSG cut structure 710 may include one or more portions aligned with slit structures 708-2 and 708-3. In some implementations, slit structures 708-2 and 708-3 are each disconnected by one or more portions of SSG cut structure 710 in the x-direction. For example, SSG cut structure 710 may include one or more portions aligned with slit structure 708-2. In some implementations, SSG cut structure 710 includes a portion between bridge structure 706 and staircase 702-3. In some implementations, SSG cut structure 710 includes a portion between bridge structure 706 and staircase 702-4. In some implementations, SSG cut structure 710 includes one or more portions between divisions 704-1 and 704-2. The location, structure, and material of SSG cut structure 710 may be similar to third portions 210-3 of SSG cut structure 210, and the detailed description is not repeated herein.

3D memory device 700 may also include one or more passage structures 716 aligned with respective slit structures (e.g., 708-2 and 708-3). Passage structure 716 may also be referred to as an "H cut" between adjacent memory fingers. Each passage structure 716 may extend vertically along the z-direction and aligned with the respective slit structure in the x-direction. Passage structure 716 may provide a conductive path for electric current in at least one stair (e.g., the stair conductively connected to passage structure 716) to flow into bridge structure 706 such that the at least one stair is conductively connected to the respective memory array structure(s) through bridge structure 706. In some implementations, 3D memory device 700 includes at least one passage structure 716 between bridge structure 706 and staircase 702-1. In some implementations, 3D memory device 700 includes at least one passage structure 716 between bridge structure 706 and staircase 702-4. In some implementations, 3D memory device 700 includes at least one passage structure 716 aligned with slit structure 708-3 and intersecting with staircase 702-1 and/or 702-2, conductively connecting the portions of staircases 702-1 and 702-2 on the two sides of slit structure 708-3 (e.g., in they-direction). The structures, materials, and functions of passage structures 716 may be similar to those of passage structures 216, and the detailed description is not repeated herein.

Different from staircase structures 226 and 326, staircase structure 726 may be employed to implement bilateral word line-driving scheme for finger control (or bilateral word line-driving scheme for bi-string control). As shown in FIGS. 7A and 7B, the first memory finger, conductively connected to bridge structure 706, can be conductively connected to one or more staircases (e.g., 702-1 and 702-3) that are dedicated to providing landing area for the word line contacts 722-2 for the first memory finger. The first memory finger in each of the first and second memory array structures can thus be controlled through bridge structure 706, the dedicated staircases 702-1 and 702-2, and the respective word line contacts. Arrows in FIGS. 7A and 7B indicate the directions of the electric current. In some implementations, SSG cut structure 710 does not extend between memory strings in the first memory finger (e.g., does not extend in bridge structure 706 to insulate memory strings from one another) such that the first memory finger is conductively connected to both staircases 702-1 and 702-2. That is, the conductive layers in each of staircases 702-1 and 702-2 are conductively connected to the conductive layers in the first memory finger in each of the first and second memory array structures. In some implementations, SSG cut structure 710 does not isolate memory strings from one another in the second memory fingers such that the second memory fingers may be conductively connected to a respective division (e.g., 704-1/704-2) as a whole.

3D memory device 700 may include a plurality of word line contacts 722-1, 722-2, and 722-3. Different from word line contacts 222-1, 222-2, and 222-3, word line contacts 722-1 and 722-2 may apply voltages for finger control, instead of string control. Word line contacts 722-3 may apply voltages for string control, similar to word line contacts 222-4. Word line contacts 722-1 may each be landed on a respective division (704-1/704-2) of staircases 702-3 and 702-4 for applying a voltage on a respective second memory finger. Word line contacts 722-3 may be landed on a plurality of stairs above the stairs and SSG cut structure 710 to implement a bilateral word-line driving scheme for finger control using DSG cut structure 730. Word line contacts 722-2 may be landed on at least one of staircases 702-1 and 702-2 for applying a voltage on the first memory finger in the first and second memory array structures. For each level, at least one word line contact 722-2 is landed on at least one of staircases 702-1 and 702-2. In some implementations, word line contacts 722-2 are landed only on staircase 702-1 (as shown in FIGS. 7A and 7B). In some implementations, word line contacts 722-2 are landed only on staircase 702-2. In some implementations, word line contacts are landed on both staircases 702-1 and 702-2 such that the first memory finger can be collectively controlled through word line contacts 722-2, staircases 702-1 and 702-2, and bridge structure 706. The materials and structure of word line contacts 722-1, 722-2, and 722-3 may be similar to those of word line contacts 222-1, 222-2, 222-3, and 222-4, and the detailed description is not repeated herein.

In some implementations, 3D memory device 700 includes a region A, which represents an area in staircase structure 726 in which word line contacts (e.g., 722-1 and 722-2) are formed for finger control by SSG cut structure 710. Memory fingers (e.g., the three memory fingers) in contact with those word line contacts can be controlled separately to implement various operations such as read, write, and erase. Optionally, 3D memory device 700 further includes a region C in staircase structure 726 in which a plurality of word line contacts 722-3 are formed on a plurality of stairs above the stairs and SSG cut structure 710. Region C may include a core region of 3D memory device 700. In some implementations, word line contacts 722-3 are formed in a top portion of staircase structure 726 to implement a bilateral word-line driving scheme for string control using DSG cut structure 730. 3D memory device 200 may further include a region B, which represents an area in staircase structure 726 in which the memory block is not divided and can be operated as a whole. Region B may be located between DSG cut structure 730 and SSG cut structure 710. The memory cells conductively connected to region B may be operated by block control.

It should be noted that, although the SSG cut structures, disclosed by the present disclosure, are each formed in (or conductively connected to) a memory block that includes three memory fingers and six memory strings, the specific structure of the SSG cut structures and the number of memory strings should not be limited by the implementations of the present disclosure. In various implementations, the number of memory strings in the memory block may be any suitable positive integer equal to or greater than 2. Specifically, the number of memory strings conductively connected to a bridge structure, the number of memory strings conductively connected to staircases without the bridge structure, and the number of staircases in the staircase zone may not be limited by the implementations of the present disclosure. For example, if more than two memory strings are conductively connected to the bridge structure, the SSG cut structure may include a plurality of first portions that divide the bridge structure into a plurality of portions such that each memory string conductively connected to the bridge structure can be conductively connected (e.g., routed to) at least one staircase that is dedicated for providing landing area for the word line contacts for controlling the respective memory string. The word line contacts for controlling each of these memory strings may be formed on each stair of the at least one staircase. The SSG cut structure may also include a plurality of second portions that (i) divide the staircase structure into the bridge structure and the staircase zone, and (ii) divide the staircases conductively connected to a plurality memory strings without the bridge structure into a plurality of divisions, each being conductively connected to the respective memory string on one side (e.g., the positive x-direction or the negative x-direction) of the memory array structure.

According to one aspect of the present disclosure, a 3D memory device includes a memory stack including a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes a SSG cut structure extending in a SSG of the memory stack and between adjacent ones of the plurality of strings. The SSG cut structure includes a first portion between a first string and a second string and extends in the bridge structure in the first lateral direction. The staircase zone includes a first staircase conductively connected to first memory cells in the first string through the bridge structure and a second staircase conductively connected to second memory cells in the second string in the first memory array structure through the bridge structure.

In some implementations, the staircase zone further includes a third staircase conductively connected to third memory cells in a plurality of third strings in the first memory array structure.

In some implementations, the first staircase includes a single staircase facing away from the second staircase in the first lateral direction.

In some implementations, the first staircase includes a first sub-staircase facing away from the second staircase in the first lateral direction and a second sub-staircase facing the first sub-staircase in the first lateral direction.

In some implementations, the first portion of the SSG cut structure extends between the first staircase and the second staircase in the second lateral direction. The first staircase is conductively connected to the first memory cells through a first portion of the bridge structure. The second staircase is conductively connected to the second memory cells in the first memory array structures through a second portion of the bridge structure. The first portion of the bridge structure is insulated from the second portion of the bridge structure by the first portion of the SSG cut structure.

In some implementations, the 3D memory device further includes an insulating structure between the first and second staircases along the second lateral direction. The first staircase is conductively connected to the first memory cells in the first string through a first portion of the bridge structure. The second staircase is conductively connected to the second memory cells in the second string through a second portion of the bridge structure. The first portion of the bridge structure is insulated from the second portion of the bridge structure by the first portion of the SSG cut structure and the insulating structure.

In some implementations, the insulating structure includes a plurality of dielectric pairs along a vertical direction that is perpendicular to the first and second lateral directions. Each of the dielectric pairs includes a first dielectric layer and a second dielectric layer.

In some implementations, the staircase zone further includes, in the first lateral direction, a fourth staircase and a fifth staircase. In some implementations, the fourth staircase is conductively connected to fourth memory cells in the second string in the second memory array structure through the bridge structure. In some implementations, the fifth staircase is conductively connected to fifth memory cells in the plurality of third strings in the second memory array structure through the bridge structure.

In some implementations, the first portion of the SSG cut structure further extends between the first staircase and the fourth staircase in the second lateral direction such that the fourth staircase is conductively connected to the fourth memory cells in the second string through a third portion of the bridge structure. The first portion of the bridge structure is insulated from the third portion of the bridge structure by the other first portion of the SSG cut structure.

In some implementations, the 3D memory device further includes another insulating structure between the fourth staircase and the first staircase along the second lateral direction and in contact with the first portion of the SSG cut structure. The fourth staircase is conductively connected to the fourth memory cells in the second string through a third portion of the bridge structure. The first portion of the bridge structure is insulated from the third portion of the bridge structure by the other first portion of the SSG cut structure.

In some implementations, the other insulating structure includes a plurality of dielectric pairs along a vertical direction that is perpendicular to the first and second lateral directions. Each of the dielectric pairs includes a first dielectric layer and a second dielectric layer.

In some implementations, the 3D memory device further includes a pair of first slit structures extending in the first lateral direction, the memory block located between the pair of first slit structures. In some implementations, the 3D memory device further includes a plurality of fingers in the second lateral direction, each of the fingers includes a pair of adjacent strings. In some implementations, the 3D memory device further includes a second slit structure extending in the first lateral direction and between adjacent fingers.

In some implementations, the first slit structures each extends continuously in the first lateral direction and the second slit structure includes a plurality of slit portions disconnected from one another in the first lateral direction.

In some implementations, the SSG cut structure further includes a second portion and the second slit structure includes the plurality of slit portions between the third and the fifth staircases. In some implementations, the second portion of the SSG cut structure is between adjacent slit portions of the second slit structure.

In some implementations, the SSG cut structure further includes a plurality of third portions extending in the first lateral direction in the fingers in the third and the fifth staircases.

In some implementations, the 3D memory device further includes a passage structure aligned with the slit structure between the bridge structure and at least one of the second staircase or the fourth staircase. The passage structure is in contact with and conductively connected to at least one stair in the respective staircase. The passage structure includes a plurality of conductive/dielectric layer pairs along a vertical direction.

In some implementations, in the at least one of the second staircase or the fourth staircase, stairs from the stair in contact with the passage structure to a bottom of the respective staircase are conductively connected to respective memory cells in the second string through the bridge structure and the passage structure. In some implementations, a rest of the stairs are conductively connected to the respective memory cells in the second string in the respective memory array structure through the bridge structure.

In some implementations, the 3D memory device further includes a second passage structure aligned with the slit structure between the bridge structure and the first staircase. The second passage structure is in contact with and conductively connected to at least one stair in the respective staircase. The second passage structure includes a plurality of conductive/dielectric layer pairs along a vertical direction.

In some implementations, in the first staircase, stairs from the stair in contact with the second passage structure to a bottom of the respective staircase are conductively connected to the first memory cells in the first string through the bridge structure and the second passage structure. In some implementations, a rest of the stairs are conductively connected to the first memory cells in the first string through the bridge structure.

According to another aspect of the present disclosure, a 3D memory device includes a memory stack includes a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes a SSG cut structure extending in a SSG of the memory stack between adjacent ones of the plurality of strings. The SSG cut structure includes a first portion extending in the bridge structure in the first lateral direction. The staircase zone includes a first group of staircases conductively connected to first memory cells in a respective one of a first number of the plurality of strings through the bridge structure; and a second group of staircases each conductively connected to second memory cells in a second number of the plurality of strings directly.

In some implementations, the first group of staircases includes a plurality of first staircases each being conductively connected to respective memory cells in a respective one of the first number of the strings. In some implementations, the second group of staircases includes a pair of second staircases each being conductively connected to the respective memory cells in all of the second number of the strings in a respective memory array structure.

In some implementations, the plurality of first staircases includes a pair of staircases conductively connected to the respective memory cells in a first string in the first and second memory array structures. In some implementations, a pair of staircases respectively conductively connected to the respective memory cells in the second string in a respective one of the first and second memory array structures.

In some implementations, the pair of second staircases are each conductively connected to the second memory cells in a plurality of third strings in a respective one of the first and second memory array structures.

In some implementations, the pair of staircases conductively connected to respective memory cells in the first string in the first and second memory array structures include a first staircase and a second staircase facing each other along a first lateral direction. In some implementations, the pair of staircases respectively connected to the second string in the respective one of the first and second memory array structures include, in the first lateral direction, a third staircase facing away from the first staircase and a fourth staircase facing away from the second staircase. In some implementations, the pair of staircases respectively connected to the plurality of third strings in a respective one of the first and second memory array structures include, in the first lateral direction, a fifth staircase facing the third staircase and a sixth staircase facing the fourth staircase.

In some implementations, the first and second staircases are conductively connected to the respective memory cells in the first string through a same portion of the bridge structure. In some implementations, the third staircase is conductively connected to the respective memory cells in the second string in the first memory array structure through a second portion of the bridge structure. In some implementations, the fourth staircase is conductively connected to the respective memory cells in the second string in the second memory array structure through a third portion of the bridge structure.

In some implementations, the first portion of the SSG cut structure further extends in the second lateral direction between the first staircase and the third staircase and between the second staircase and the fourth staircase.

In some implementations, the memory device of claim further includes an insulating structure extending in the second lateral direction. The insulating structure is between the first staircase and the third staircase and between the second staircase and the fourth staircase.

In some implementations, the insulating structure includes a plurality of dielectric pairs along a vertical direction that is perpendicular to the first and second lateral directions. Each of the dielectric pairs includes a first dielectric layer and a second dielectric layer.

In some implementations, the 3D memory device further includes a pair of first slit structures extending in the first lateral direction, the memory block located between the pair of first slit structures. In some implementations, a plurality of fingers in the second lateral direction, each of the fingers includes a pair of adjacent strings. In some implementations, a second slit structure extending in the first lateral direction and between adjacent fingers.

In some implementations, the first slit structures each extends continuously in the first lateral direction. In some implementations, the second slit structure includes a plurality of slit portions disconnected from one another in the first lateral direction.

In some implementations, the SSG cut structure further includes a second portion in the third and fifth staircases. In some implementations, the second portion of the SSG cut structure is between adjacent slit portions of the second slit structure.

In some implementations, the SSG cut structure further includes a plurality of third portions extending in the first lateral direction in the fingers in the third and the fifth staircases.

In some implementations, the 3D memory device further includes a first passage structure in the second staircase or the fourth staircase. The first passage structure is between adjacent slit portions of the second slit structure and comprises a plurality of conductive/dielectric layer pairs along a vertical direction.

In some implementations, the 3D memory device further includes a second passage structure in the first staircase. The second passage structure is between adjacent slit portions of the second slit structure and comprises a plurality of conductive/dielectric layer pairs along a vertical direction.

According to still another aspect of the present disclosure, a 3D memory device includes a memory stack includes a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes a SSG cut structure extending in a SSG of the memory stack between adjacent ones of the plurality of strings. The SSG cut structure includes a first portion extending in the bridge structure in the first lateral direction. The staircase zone includes a first group of staircases conductively connected to first memory cells in a respective one of a first number of the plurality of strings through the bridge structure. The staircase zone also includes a second group of staircases each conductively connected to second memory cells in a second number of the plurality of strings directly.

In some implementations, the first group of staircases includes a plurality of first staircases conductively connected to respective memory cells in a respective one of the first number of the strings. In some implementations, the second group of staircases comprises a pair of second staircases each conductively connected to the respective memory cells in all of the second number of the strings in a respective memory array structure.

In some implementations, the plurality of first staircases include a pair of staircases conductively connected to the respective memory cells in a first string in the first and second memory array structures, and a pair of staircases respectively conductively connected to the respective memory cells in the second string in a respective one of the first and second memory array structures.

In some implementations, the pair of second staircases are each conductively connected to the second memory cells in a plurality of third strings in a respective one of the first and second memory array structures.

In some implementations, the pair of staircases conductively connected to respective memory cells in the first string in the first and second memory array structures include a first staircase and a second staircase facing each other along a first lateral direction. In some implementations, the pair of staircases respectively connected to the respective memory cells in the second string in the respective one of the first and second memory array structures include, in the first lateral direction, a third staircase facing away from the first staircase and a fourth staircase facing away from the second staircase. In some implementations, the pair of staircases respectively connected to the second memory cells in the plurality of third strings in a respective one of the first and second memory array structures include, in the first lateral direction, a fifth staircase facing the third staircase and a sixth staircase facing the fourth staircase.

In some implementations, the first and second staircases are conductively connected to the respective memory cells in the first string through a first portion of the bridge structure. In some implementations, the third staircase is conductively connected to the respective memory cells in the second string in the first memory array structure through a second portion of the bridge structure. In some implementations, the fourth staircase is conductively connected to the respective memory cells in the second string in the second memory array structure through a third portion of the bridge structure.

In some implementations, the first portion of the SSG cut structure further extends in the second lateral direction between the first staircase and the third staircase and between the second staircase and the fourth staircase.

In some implementations, the 3D memory device further includes an insulating structure extending in the second lateral direction, wherein the insulating structure is between the first staircase and the third staircase and between the second staircase and the fourth staircase.

In some implementations, the insulating structure includes a plurality of dielectric pairs along a vertical direction that is perpendicular to the first and second lateral directions, each of the dielectric pairs including a first dielectric layer and a second dielectric layer.

In some implementations, the 3D memory device further includes a pair of first slit structures extending in the first lateral direction, the memory block located between the pair of first slit structures, a plurality of fingers in the second lateral direction, each of the fingers comprises a pair of adjacent strings, and a second slit structure extending in the first direction and between adjacent fingers.

In some implementations, the first slit structures each extends continuously in the first lateral direction, and the second slit structure comprises a plurality of slit portions disconnected from one another in the first lateral direction.

In some implementations, the SSG cut structure further includes a second portion in the third and the fifth staircases, and the second portion of the SSG cut structure is between adjacent slit portions of the second slit structure.

In some implementations, the SSG cut structure further includes a plurality of third portions extending in the first lateral direction in the fingers in the third and the fifth staircases.

In some implementations, the 3D memory device further includes a first passage structure in the third staircase or the fourth staircase. The first passage structure is between adjacent slit portions of the second slit structure and includes a plurality of conductive/dielectric layer pairs along a vertical direction.

In some implementations, the 3D memory device further includes a second passage structure in the first staircase or the second staircase. The second passage structure is between adjacent slit portions of the second slit structure and includes a plurality of conductive/dielectric layer pairs along a vertical direction.

According to yet another aspect of the present disclosure, a 3D memory device includes a memory stack including a memory block. The memory block includes a first memory array structure, a staircase structure, a second memory array structure in a first lateral direction, and a plurality of strings in a second lateral direction perpendicular to the first lateral direction. The staircase structure includes a staircase zone and a bridge structure adjacent to the staircase zone in the second lateral direction. The 3D memory device also includes an SSG cut structure extending in a SSG of the memory stack between adjacent ones of the plurality of strings. The SSG cut structure includes a first portion of extending in the bridge structure in the first lateral direction. The first portion of the SSG cut structure is between a first portion and a second portion of the bridge structure and between the first portion and a third portion of the bridge structure. The staircase zone includes a pair of staircases conductively connected to first memory cells in a first string in the first and second memory array structures through the first portion of the bridge structure, and a pair of staircases connected to second memory cells in a second string in a respective one of the first and second memory array structures through respectively the second portion and the third portion of the bridge structure.

In some implementations, the staircase zone further includes a pair of staircases respectively connected to third memory cells in a plurality of third strings in a respective one of the first and second memory array structures.

In some implementations, the pair of staircases conductively connected to the first memory cells in the first string comprise a first staircase and a second staircase facing each other along a first lateral direction. In some implementations, the pair of staircases respectively connected to the second memory cells in the second string comprise, in the first lateral direction, a third staircase facing away from the first staircase and a fourth staircase facing away from the second staircase. In some implementations, the pair of staircases respectively connected to the third memory cells in the plurality of third strings comprise, in the first lateral direction, a fifth staircase facing the third staircase and a sixth staircase facing the fourth staircase.

In some implementations, the first and second staircases are conductively connected to the first memory cells in the first string through a same portion of the bridge structure, the third staircase is conductively connected to the second memory cells in the second string in the first memory array structure through a second portion of the bridge structure, and the fourth staircase is conductively connected to the second memory cells in the second string in the second memory array structure through a third portion of the bridge structure.

In some implementations, the first portion of the SSG cut structure further extends in the second lateral direction between the first staircase and the third staircase and between the second staircase and the fourth staircase.

In some implementations, the 3D memory device further includes an insulating structure extending in the second lateral direction, wherein the insulating structure is between the first staircase and the third staircase and between the second staircase and the fourth staircase.

In some implementations, the insulating structure includes a plurality of dielectric pairs along a vertical direction that is perpendicular to the first and second lateral directions, each of the dielectric pairs comprising a first dielectric layer and a second dielectric layer.

In some implementations, the 3D memory device further includes a pair of first slit structures extending in the first lateral direction, the memory block located between the pair of first slit structures, a plurality of fingers in the second lateral direction, each of the fingers comprises a pair of adjacent strings, and a second slit structure extending in the first direction and between adjacent fingers.

In some implementations, the first slit structures each extends continuously in the first lateral direction, and the second slit structure comprises a plurality of slit portions disconnected from one another in the first lateral direction.

In some implementations, the SSG cut structure further comprises a second portion in the third and the fifth staircases, and the second portion of the SSG cut structure is between adjacent slit portions of the second slit structure.

In some implementations, the SSG cut structure further comprises a plurality of third portions extending in the first lateral direction in the fingers in the third and the fifth staircases.

In some implementations, the 3D memory device further includes a first passage structure in the third staircase or the fourth staircase. The first passage structure is between adjacent slit portions of the second slit structure and comprises a plurality of conductive/dielectric layer pairs along a vertical direction.

In some implementations, the 3D memory device further includes a second passage structure in the first staircase or the second staircase. The second passage structure is between adjacent slit portions of the second slit structure and comprises a plurality of conductive/dielectric layer pairs along a vertical direction.

According to yet another aspect of the present disclosure, a method for forming a 3D memory device is provided. The method includes forming a first number of dielectric pairs on a substrate having an array region and a staircase region, each of the dielectric pairs including a first layer of a sacrificial material and a second layer of a dielectric material different from the sacrificial material. The method also includes forming an initial SSG cut structure in the first number of dielectric pairs. The method also includes forming a second number of dielectric pairs on the first number of dielectric pairs to form a stack structure. The method further includes patterning the stack structure to form a first dielectric structure and a second dielectric structure in the array region, a staircase structure in the staircase region, and a SSG cut structure in the array region and the staircase region. The staircase structure includes a dielectric bridge and a plurality of staircases. The plurality of staircases are aligned along a first lateral direction and include a first staircase and a second staircase each coupled to a first dielectric string in the first and second dielectric structures through the dielectric bridge.

In some implementations, the plurality of staircases further include a third staircase coupled to a second dielectric string in the first dielectric structure though the dielectric bridge and a fourth staircase coupled to the second dielectric string in the second dielectric structure through the dielectric bridge.

In some implementations, forming the plurality of staircases further include forming a fifth staircase coupled to a plurality of third dielectric strings in the first dielectric structure and a sixth staircase coupled to the plurality of third dielectric strings in the second dielectric structure.

In some implementations, the method further includes patterning the first and second number of dielectric pairs to form a plurality of slit structures extending in the staircase structure along the first lateral direction. One of the slit structures between the dielectric bridge and the plurality of staircases is disconnected by at least one passage portion that is in contact with at least one of the first and second staircases.

In some implementations, forming the slit structure between the dielectric bridge and the plurality of staircases further includes disconnecting the slit structure adjacent to the first and third staircases and adjacent to the second and fourth staircases.

In some implementations, forming the initial SSG cut structure includes, in the first lateral direction, forming a plurality of trenches in the dielectric bridge in the first number of dielectric pairs. The plurality of trenches divide the dielectric bridge adjacent the third and fifth staircases into a first portion and a second portion, and divide the dielectric bridge adjacent to the fourth and sixth staircases into a first portion and a second portion. The first portions of the dielectric bridge are both coupled to the first dielectric string in the first and second dielectric structures. The second portions of the dielectric bridge adjacent to the third and fifth staircases are coupled to the second dielectric string in the first dielectric structure. The second portions of the dielectric bridge adjacent to the fourth and sixth staircases are coupled to the second dielectric string in the second dielectric structure. In some implementations, forming the initial SSG cut structure also includes forming at least one trench in a respective region corresponding to each of the fifth staircase and the sixth staircase in the first number of dielectric pairs, dividing the respective region into a plurality of divisions. Each division is coupled to a respective dielectric string. In some implementations, forming the initial SSG cut structure further includes depositing an insulating material to fill up the trenches.

In some implementations, forming the initial SSG cut structure further includes, in a second lateral direction perpendicular to the first lateral direction, forming a pair of other trenches each in contact with the respective trench in the first lateral direction. One of the other trenches is between the third and fifth staircases, and the one of the other trenches is between the fourth and sixth staircases. In some implementations, forming the initial SSG cut structure further includes depositing the insulating material to fill up the other trenches.

In some implementations, the method further includes removing the sacrificial material in the staircase structure to form a plurality of lateral recesses in the dielectric bridge, the first and second dielectric structures, and the plurality of staircases. In some implementations, the method further includes depositing a conductor material to fill up lateral recesses to form a plurality of conductive layers in a bridge structure and the plurality of staircases, and at least one passage structure in the at least one passage portion.

In some implementations, the method further includes removing, partially, the sacrificial material in the staircase structure to retain a portion of the sacrificial material between the first and third staircases and between the second and fourth staircases to form a plurality of lateral recesses in the dielectric bridge, the first and second dielectric structures, and the plurality of staircases. The portions of retained sacrificial material are each in contact with the SSG cut structure in the dielectric bridge. In some implementations, the method further includes depositing a conductor material to fill up lateral recesses to form a plurality of conductive layers in a bridge structure and the plurality of staircases, and at least one passage structure in the at least one passage portion.

In some implementations, the method further includes forming a plurality of source contacts in the slit structures.

The foregoing description of the specific implementations will so reveal the general nature of the present disclosure that others can, by applying knowledge within the skill of the art, readily modify and/or adapt for various applications such specific implementations, without undue experimentation, without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary implementations of the present disclosure as contemplated by the inventor(s), and thus, are not intended to limit the present disclosure and the appended claims in any way.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a memory stack comprising a memory block, the memory block comprising memory array structures and a staircase structure in a first lateral direction, and fingers in a second lateral direction perpendicular to the first lateral direction, the fingers comprising a first finger and a second finger; and
a source-select-gate (SSG) cut structure extending through a portion of the memory stack and between the first finger and the second finger,
wherein the staircase structure comprises a first staircase connected to first memory cells in the first finger and a second staircase connected to second memory cells in the second finger.

2. The 3D memory device of claim 1, wherein the staircase structure comprising a staircase zone and a bridge structure adjacent to the staircase zone in the second lateral direction, the first staircase located in the staircase zone and connected to the first memory cells in the first finger through the bridge structure.

3. The 3D memory device of claim 2, further comprising a passage structure between the bridge structure and the staircase zone.

4. The 3D memory device of claim 3, wherein the first staircase is connected to the bridge structure through the passage structure.

5. The 3D memory device of claim 1, wherein the first staircase comprises a first sub-staircase facing away from the second staircase in the first lateral direction and a second sub-staircase facing the second staircase in the first lateral direction.

6. The 3D memory device of claim 1, wherein the memory array structures comprise a first memory array structure and a second array structure.

7. The 3D memory device of claim 6, wherein the staircase structure is between the first memory array structure and the second array structure in the first lateral direction.

8. The 3D memory device of claim 7, wherein the second staircase comprises a third sub-staircase connected to the second memory cells of the first memory array structure and a fourth sub-staircase connected to the second memory cells of the second array structure.

9. The 3D memory device of claim 1, further comprising a slit structure extending in the first lateral direction and between the first finger and the second finger.

10. The 3D memory device of claim 9, wherein the SSG cut structure aligned with the slit structure.

11. The 3D memory device of claim 1, wherein the SSG cut structure comprises a dielectric material.

12. The 3D memory device of claim 3, wherein the passage structure comprises conductive layers and dielectric layers interleaved along a third direction perpendicular to the first lateral direction and the second lateral direction.

13. A three-dimensional (3D) memory device, comprising:
- a memory stack comprising a memory block, the memory block comprising memory array structures and a staircase structure in a first lateral direction, and strings in a second lateral direction perpendicular to the first lateral direction, the strings comprising a first string and a second string;
- a top-select-gate (TSG) cut structure extending through a top portion of the memory stack and between the first string and the second string; and
- a source-select-gate (SSG) cut structure extending through a bottom portion of the memory stack and between the first string and the second string, wherein the staircase structure comprises:
- a first group of staircases comprising a first staircase connected to first memory cells in the first string, and a second staircase adjacent to the first staircase in the second lateral direction and connected to second memory cells in the second string; and
- a second group of staircases adjacent to the first group of staircases in the first lateral direction and comprising a third staircase connected to memory cells in the memory block.

14. The 3D memory device of claim 13, further comprising a third group of staircases comprising a fourth staircase connected to the first memory cells in the first string, a fifth staircase adjacent to the fourth staircase in the second lateral direction and connected to the second memory cells in the second string.

15. The 3D memory device of claim 14, wherein the second group of staircases are between the first group of staircases and the third group of staircases in the first lateral direction.

16. The 3D memory device of claim 14, wherein the SSG cut structure is between the first staircase and the second staircase, and the TSG cut structure is between the fourth staircase and the fifth staircase.

17. The 3D memory device of claim 13, further comprising slit structures extending in the first lateral direction, the SSG cut structure is between adjacent slit structures of the slit structures.

18. The 3D memory device of claim 13, wherein the staircase structure comprising a staircase zone and a bridge structure adjacent to the staircase zone in the second lateral direction, the first staircase located in the staircase zone and connected to the first memory cells in the first string through the bridge structure.

19. A three-dimensional (3D) memory device, comprising:
- a memory stack comprising a memory block, the memory block comprising memory array structures and a staircase structure in a first lateral direction, and fingers in a second lateral direction perpendicular to the first lateral direction, the fingers comprising a first finger and a second finger;
- a top-select-gate (TSG) cut structure extending through a top portion of the memory stack and between the first finger and the second finger; and
- a source-select-gate (SSG) cut structure extending through a bottom portion of the memory stack and between the first finger and the second finger, wherein the staircase structure comprises:
- a first group of staircases comprising a first staircase connected to first memory cells in the first finger, a second staircase adjacent to the first staircase in the second lateral direction and connected to second memory cells in the second finger; and
- a second group of staircases adjacent to the first group of staircases in the first lateral direction and comprising a third staircase connected to memory cells in the memory block.

20. The 3D memory device of claim 19, further comprising slit structures extending in the first lateral direction, the memory block is between adjacent slit structures of the slit structures.

* * * * *